(12) United States Patent
Iwamoto et al.

(10) Patent No.: US 6,466,103 B2
(45) Date of Patent: Oct. 15, 2002

(54) SAW FILTER DUPLEXER DEVICE WITH OPTIMAL LOCATION OF A PHASE MATCHING LINE PATTERN AND WIRE BONDING PADS

(75) Inventors: Yasuhide Iwamoto, Kawasaki (JP); Osamu Ikata, Kawasaki (JP); Nobuo Hirasawa, Suzaka (JP); Hidenori Fukushima, Suzaka (JP)

(73) Assignees: Fujitsu Limited, Kawasaki (JP); Fujitsu Media Devices Limited, Nagano (JP)

( * ) Notice: Subject to any disclaimer, the term of this patent is extended or adjusted under 35 U.S.C. 154(b) by 0 days.

(21) Appl. No.: 09/892,658

(22) Filed: Jun. 28, 2001

(65) Prior Publication Data

US 2002/0109561 A1 Aug. 15, 2002

(30) Foreign Application Priority Data

Feb. 9, 2001 (JP) ........................................ 2001-034109

(51) Int. Cl.[7] .............................. H03H 9/72; H03H 9/64
(52) U.S. Cl. ...................................... 333/133; 333/193
(58) Field of Search .......................... 333/133, 193–196

(56) References Cited

U.S. PATENT DOCUMENTS

| | | | | | |
|---|---|---|---|---|---|
| 5,554,960 | A | * | 9/1996 | Ohnuki et al. | 333/132 |
| 5,561,406 | A | * | 10/1996 | Ikata et al. | 333/126 |
| 5,786,738 | A | * | 7/1998 | Ikata et al. | 333/133 |
| 5,859,473 | A | * | 1/1999 | Ikata et al. | 257/723 |
| 6,351,194 | B2 | * | 2/2002 | Takahashi et al. | 333/133 |
| 6,380,823 | B1 | * | 4/2002 | Ikata et al. | 333/133 |

FOREIGN PATENT DOCUMENTS

| | | | | |
|---|---|---|---|---|
| JP | 5-235688 | * | 9/1993 | 333/193 |
| JP | 6-6170 | * | 1/1994 | 333/193 |
| JP | 8-191230 | * | 7/1996 | |
| JP | 9-270604 | * | 10/1997 | |
| JP | 10-126213 | | 5/1998 | |
| JP | 2000-68785 | * | 3/2000 | |

* cited by examiner

*Primary Examiner*—Robert Pascal
*Assistant Examiner*—Barbara Summons
(74) *Attorney, Agent, or Firm*—Armstrong, Westerman & Hattori, LLP

(57) ABSTRACT

This invention is a duplexer device comprising two surface acoustic wave filters having band center frequencies different from each other and a line pattern for matching phases of the two surface acoustic Wave filters, wherein provided are: a wire bonding pad layer having a plurality of pads including. pads. for connecting the line pattern with terminals on the surface acoustic wave filters and pads for connecting a common terminal connected to. an external antenna with the line pattern; and a first pad connecting one of the surface acoustic wave filters and a first end of the line pattern and a second pad connecting the common terminal and a second end of the line pattern being arranged at positions that are the most distant from each other inside the wire bonding pad layer.

14 Claims, 33 Drawing Sheets

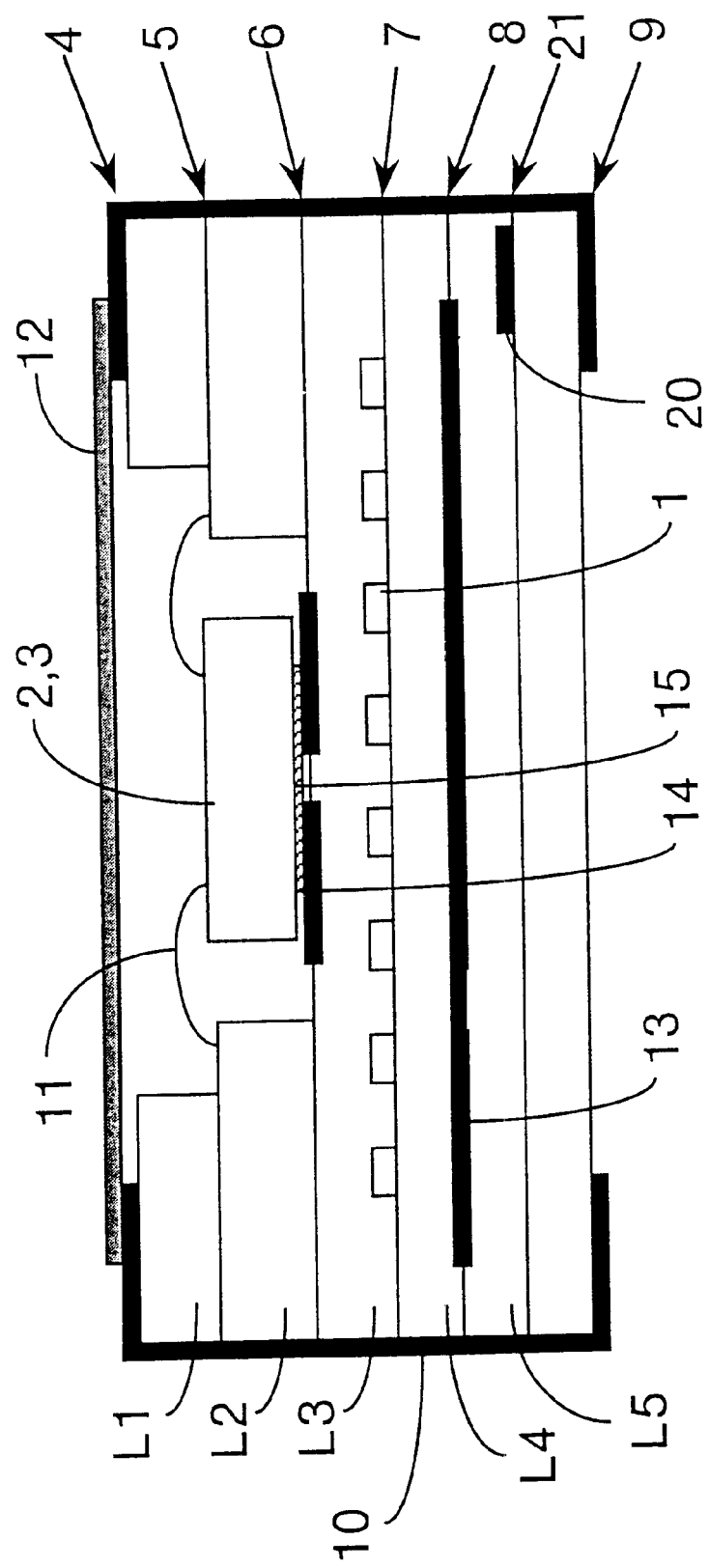

FIG. 29 (a) (Prior Art)  FIG. 29 (b) (Prior Art)
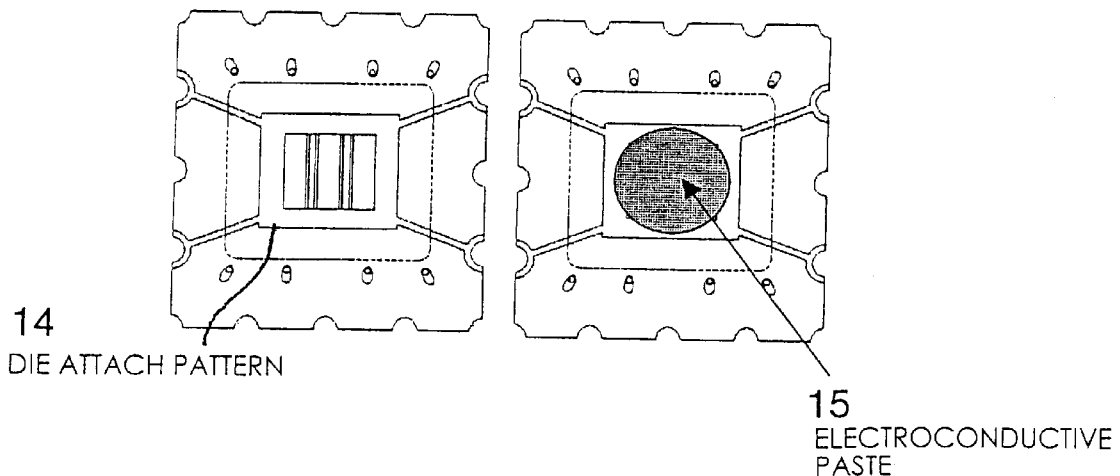
14
DIE ATTACH PATTERN
15
ELECTROCONDUCTIVE PASTE
FIG. 30 (a)  FIG. 30 (b)
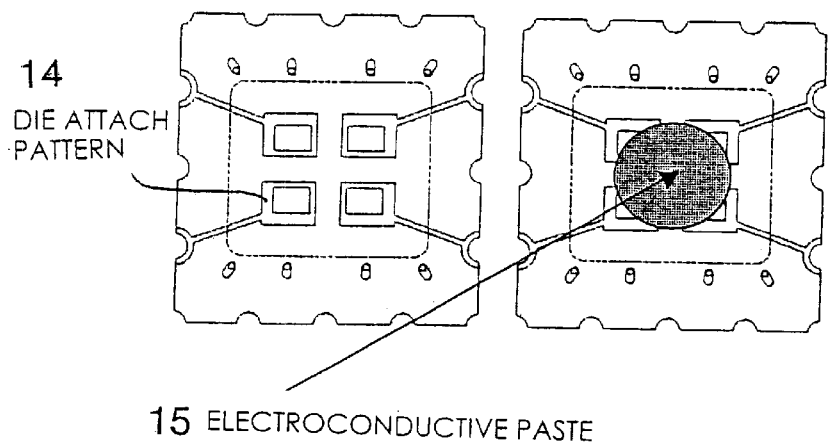
14
DIE ATTACH PATTERN
15 ELECTROCONDUCTIVE PASTE

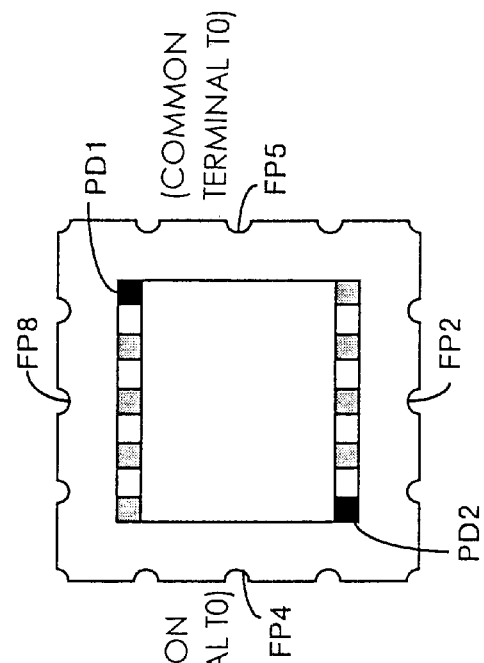
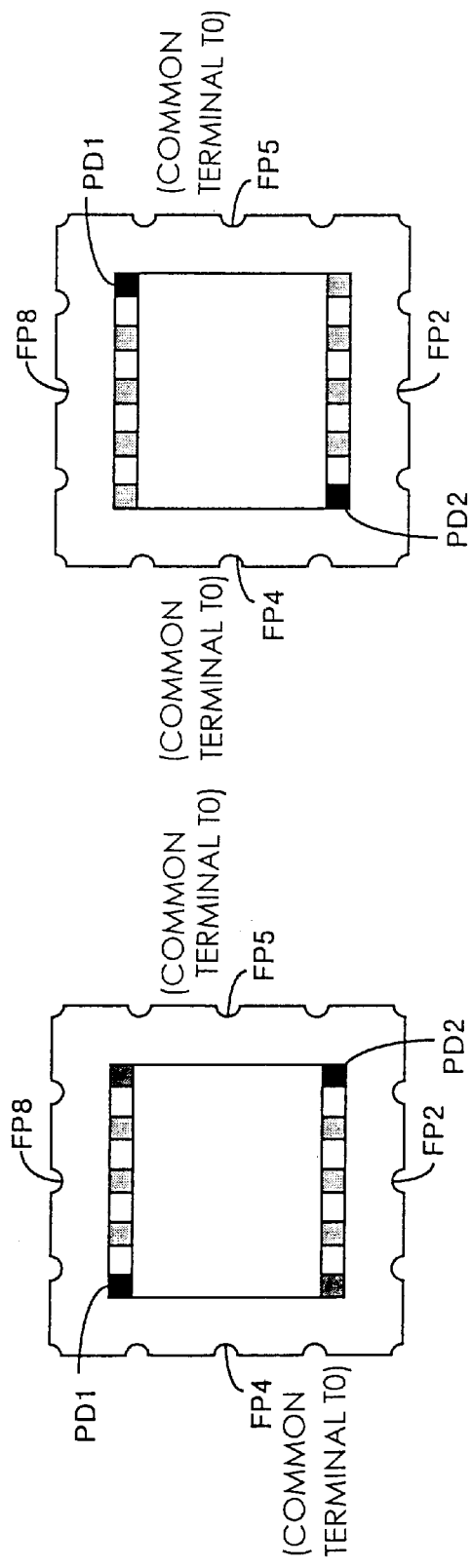
FIG. 33 (a)
FIG. 33 (b)

SAW FILTER DUPLEXER DEVICE WITH OPTIMAL LOCATION OF A PHASE MATCHING LINE PATTERN AND WIRE BONDING PADS

CROSS-REFERENCE TO RELATED APPLICATION

This application is related to Japanese Patent Application No. 2001-034109 filed in Feb. 9, 2001, whose priority is claimed under 35 USC §119, the disclosure of which is incorporated by reference in its entirety.

BACKGROUND OF THE INVENTION

1. Field of the Invention

The present invention relates to a duplexer device and particularly a duplexer device using a surface acoustic wave filter.

2. Description of the Related Art

Recently, a mobile phone and a mobile information terminal have been quickly spread with development of mobile communication systems and have been demanded to have a small size and high performance.

The radio frequency in use covers wide bands, for example, from 800 MHz to 1 GHz bands and from 1.5 to 2.0 GHz bands.

In the recent development of a mobile phone, terminals have been developed to have high functionality, for example, a dual mode (e.g., a combination of an analog mode and a digital mode, or a combination of digital modes, i.e., a TDMA (time division multiple access) mode and a CDMA (code division multiple access) mode and a dual band (e.g., a combination of an 800 MHz band and a 1.9 GHz band, or a combination of a 900 MHz band and a 1.8 GHz band or a 1.5 GHz band).

Along with the trend, parts used in a mobile phone (such as a filter) are also demanded to have high functionality. In addition to the demand of high functionality, a small size and a low production cost are also demanded.

The mobile communication apparatus utilizes an antenna duplexer in an RF section branching and generating signals transmitted and received through an antenna.

FIG. 36 is a block diagram showing a radio frequency section of conventionally used mobile phone.

An audio signal 100 inputs from a microphone are converted to a modulated signal of the modulation system of the mobile phone system by a modulator 101 and then converted to a designated carrier frequency by a local oscillator 108. Thereafter, the signal passes through an interstage filter 102, which selects only a signal having the prescribed transmission frequency, and then amplified to a desired signal intensity by a power amplifier 103, and transmitted to an antenna duplexer 105. The antenna duplexer 105 transmits only the signals of the designated transmission frequency to an antenna 104, and the antenna 104 transmits the signal as a radio signal into the air.

On the other hand, a signal received by the antenna 104 is transmitted to the antenna duplexer 105 to select only a signal of a designated frequency. The selected signal is amplified by a low-noise amplifier 106 and transmitted to an IF filter 110 through an interstage filter 107, and only a message signal is selected by the IF filter 110. The signal is transmitted to a demodulator 111 and taken out as an audio signal 100. The antenna duplexer 105 is positioned between the antenna 104 and the so-called audio signal processing circuit and has such a function that the transmission signal and the reception signal are distributed to prevent interference of them.

The antenna duplexer necessarily has at least a transmission filter and a reception filter, and in order to prevent interference of the transmission signal and the reception signal, it also has a matching circuit, which is also referred to as a phase matching circuit or a line pattern for phase matching.

The antenna duplexer for a highly functional terminal includes a complex duplexer with a dielectric material or a surface acoustic wave filter using a dielectric material on at least one part, and a constitution containing only a surface acoustic wave filter. A duplexer using a dielectric material has a large size and is difficult to make a mobile terminal small and thin.

Even the case using a surface acoustic wave duplexer on one part, the size of the dielectric material device prevents a mobile terminal from having a small and thin size.

A conventional duplexer using a surface acoustic wave filter includes a module type comprising a printed circuit board carrying separate filters and a matching circuit, and a one-piece type comprising filter chips for transmission and reception mounted in a multi-layer ceramic package and a matching circuit provided inside the package.

The duplexer of these types can be reduced in volume by a ratio of about from 1/3 to 1/15 and in height by a ratio of about from 1/2 to 1/3 in comparison to the duplexer using a dielectric material. The cost of the duplexer can be equivalent to the dielectric material device by using the surface acoustic wave device and reducing the size of the device.

In order to cope with the demand for further reduction in size, which will arise in future, it is necessary to use the structure using a multi-layer ceramics package described in Japanese Unexamined Patent Publication No. Hei 10(1998)-126213 and is also necessary to form two filters on one chip and to apply a flip chip mounting technique using no wire connection. In any case, two components, i.e., a duplexer package capable of being airtightly sealed, which carries two surface acoustic filters, and a matching circuit for constituting the duplexer with the two filters, are necessary.

The matching circuit is formed by arranging a line pattern having a prescribed length in one layer in a package having a multi-layer structure.

In order to satisfy the demanded characteristics as a duplexer and to cope with the demand of reduction in the size of the duplexer package, the arrangement of the line pattern of the matching circuit is necessarily considered.

Particularly, in the case where the line pattern and external connection terminals (wire bonding pads) of a duplexer package are arranged closely, there is a problem in that sufficient isolation cannot be ensured, and the depression characteristics outside the pass bands of the two surface acoustic filters constituting the duplexer are deteriorated.

SUMMARY OF THE INVENTION

The invention is duplexer device in that isolation between a line pattern of a matching circuit and signal terminals of a duplexer package is sufficiently ensured, so as to stabilize the characteristics of the duplexer.

The invention relates to a duplexer device comprising two surface acoustic wave filters having band center frequencies different from each other and a line pattern for matching phases of the two surface acoustic wave filters, wherein provided are: a wire bonding pad layer having a plurality of pads including pads for connecting the line pattern with terminals on the surface acoustic wave filters and pads for connecting a common terminal connected to an external antenna with the line pattern; and a first pad connecting one of the surface acoustic. wave filters and a first end of the line pattern and a second pad connecting the common terminal and a second end of the line pattern being arranged at positions that are the most distant from each other inside the wire bonding pad layer.

The invention also relates to a duplexer device comprising two surface acoustic wave filters having band center frequencies different from each other and a line pattern for matching phases of the two surface acoustic wave filters, wherein provided are: a wire bonding pad layer having a plurality of pads including pads for connecting the line pattern with terminals on the surface acoustic wave filters and pads for connecting a common terminal connected to an external antenna with the line pattern; a line pattern layer located below the wire bonding pad layer, the line pattern layer having the line pattern; and an external connection terminal layer located below the line pattern layer, the external connection terminal layer having an external connection terminal for connecting the surface acoustic wave filters with an external circuit, the line pattern layer being formed so that a distance dS between a point in the line pattern layer, at which a path connecting the terminal on the surface acoustic wave filter with the external connection terminal intersects the line pattern layer, and an arbitrary point on the line pattern is set to a prescribed value or more.

According to the invention, a duplexer device of a small size stabilizing the depression characteristics of the counterpart can be provided.

BRIEF DESCRIPTION OF THE DRAWINGS

FIG. 21 is a schematic cross sectional view showing a cross sectional structure of an embodiment of the duplexer device according to the invention.

FIGS. 29($a$) and 29($b$) are plane views showing plane structures of a die attach layer of a conventional duplexer device.

FIGS. 30($a$) and 30($b$) are plane views showing plane structures of a die attach layer of the duplexer device according to the invention.

FIGS. 33($a$) and 33($b$) are plane views showing embodiments of the wire bonding pad layer according to the invention.

DESCRIPTION OF THE PREFERRED EMBODIMENTS

It is preferred in the invention that the wire bonding pad layer has a rectangular space in a substantial center thereof, in which the two surface acoustic wave filters are mounted, and the rectangular space is surrounded by the plural pads, where the first pad and the second pad are arranged at diagonal corners with the rectangular space intervening therebetween.

It is also possible that the common terminal is formed in the external connection terminal layer, and a common terminal lead line for connecting the second pad and the common terminal is formed in a layer different from the line pattern layer.

In particular, the common terminal lead line may be formed in the wire bonding pad layer and may be formed in a layer below the line pattern layer. According to the configuration, isolation between the line pattern and the external connection terminal can be improved.

A common GND layer having a GND pattern formed therein may be provided between the layer having the common terminal lead line formed therein and the line pattern layer.

From the standpoint of preventing influences of external noise, side surfaces of the foregoing layers may be covered with the GND layer.

It is also possible that a die attach layer for mounting the surface acoustic wave filters is provided below the wire bonding pad layer but above the line pattern layer, a die attach pattern for connecting the surface acoustic wave filters to a GND is formed as patterns divided into two or more of the die attach layer, and the divided die attach patterns are in contact with the surface acoustic wave filters through a paste.

It is preferred that the plural pads formed on the wire bonding pad layer are formed to have a predetermined distance from each other.

In order to obtain good frequency characteristics of the duplexer, the predetermined distance is preferably 0.3 mm or more and is smaller than the rectangular space for mounting the surface acoustic wave filters.

The distance dS may satisfy 1.075 mm≦dS in a duplexer device having a size of 5 mm (width)×5 mm (length)×1.5 mm (height) in order to obtain good depression characteristics.

The invention will be described in more detail with reference to embodiments shown by the drawings, but the invention is not construed as being limited thereto.

Figure 1:
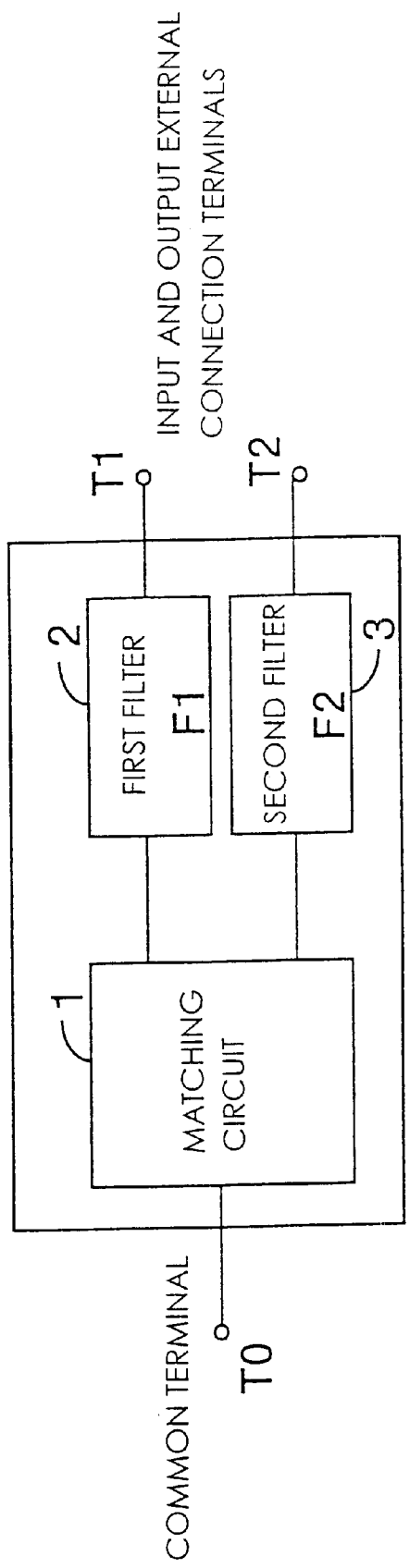
FIG. 1 is a schematic block diagram of the duplexer according to the invention.

FIG. 1 is a schematic block diagram of the duplexer according to the invention.

The duplexer comprises two SAW filters 2 (F1) and 3 (F2) and one matching circuit 1 and also has a common terminal T0 connected to an antenna and external connection terminals T1 and T2 for input and output connected to an external circuit.

A surface acoustic wave filter (hereinafter referred to as a SAW filter) combining surface acoustic wave resonators is used as the filters F1 and F2 from the standpoint of miniaturization and demanded performance.

The matching circuit 1 is provided between the common terminal T0 and the SAW filters in order to reduce interference between the two SAW filters to obtain the desired filter characteristics. While the matching circuit 1 may be provided between the common terminal a T0 and the filter F1 and between the common terminal T0 and the filter F2, respectively, it is preferred that only one matching circuit is provided between the common terminal T0 and one of the filters from the standpoint of miniaturization. In the following description, the case will be exemplified where the matching circuit is provided between the common terminal T0 and the filter F2.

Figure 2:
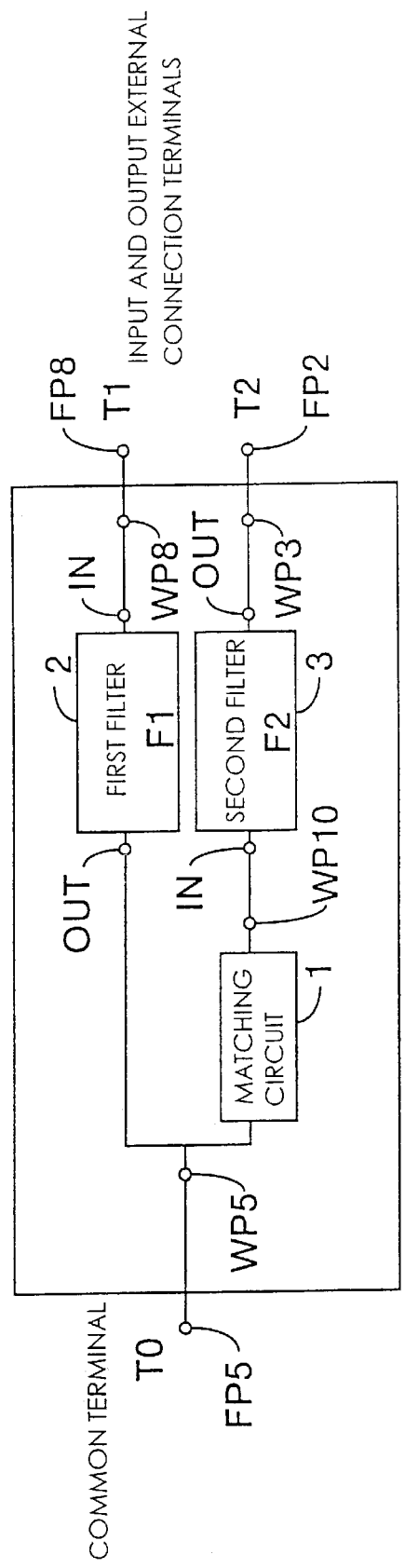
FIG. 2 is a schematic block diagram of an embodiment of the duplexer according to the invention.

FIG. 2 is a schematic block diagram of an embodiment of the duplexer according to the invention, in which the matching circuit 1 is provided between the common terminal T0 and the filter F2.

As it will be described later, the symbols starting with FP denote wiring pads on the side surface of the package (foot pads), the symbols starting with WP denote wire bonding pads in the wire bonding pad layer (wire pads, hereinafter sometimes simply referred to as pads), and the symbols IN and OUT denote connection terminals arranged on the filter chips 2 and 3, respectively.

The matching circuit 1 is generally formed with a material containing tungsten or copper as the main component in the form of a long line having a prescribed length. The matching circuit 1 has a width of about from 0.1 to 0.2 mm and a line length of about several tens mm, and the line length is determined by the relationship with the center frequency of the demanded SAW filter. In the following embodiments, the matching pattern 1 is sometimes called as a line pattern, which has two ends, and one end of the line pattern (first end) is referred to as LP1, whereas the other end (second end) is referred to as LP2.

Figure 3:
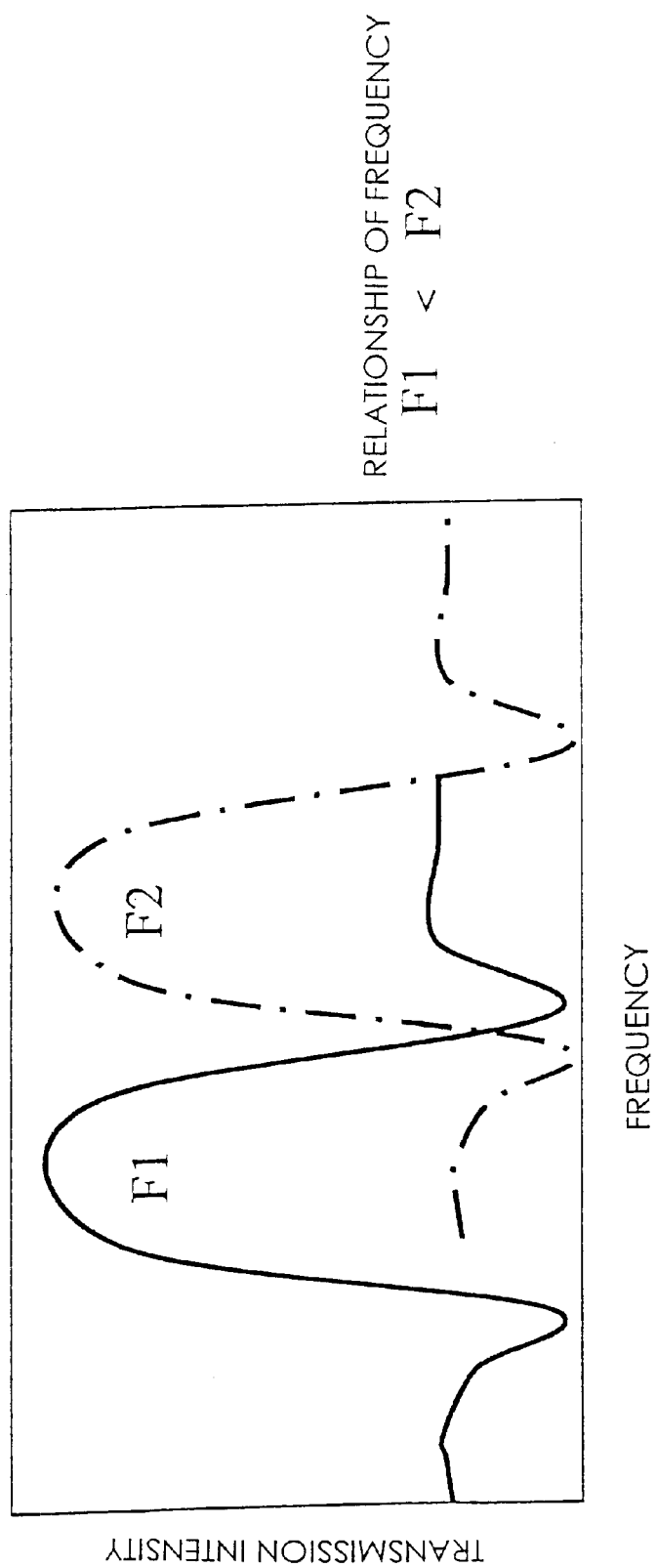
FIG. 3 is a graph showing frequency characteristics of two SAW filters used in the duplexer according to the invention.

FIG. 3 is a graph showing the frequency characteristics of the two SAW filters F1 and F2 used in the duplexer according to the invention. The SAW filters F1 and F2 have band center frequencies different from each other (F1<F2), and for example, it can be fabricated in such a manner that the band center frequency of the SAW filter F1 is 836 MHz, and the band center frequency of the SAW filter F2 is 881 MHz.

Figure 4:
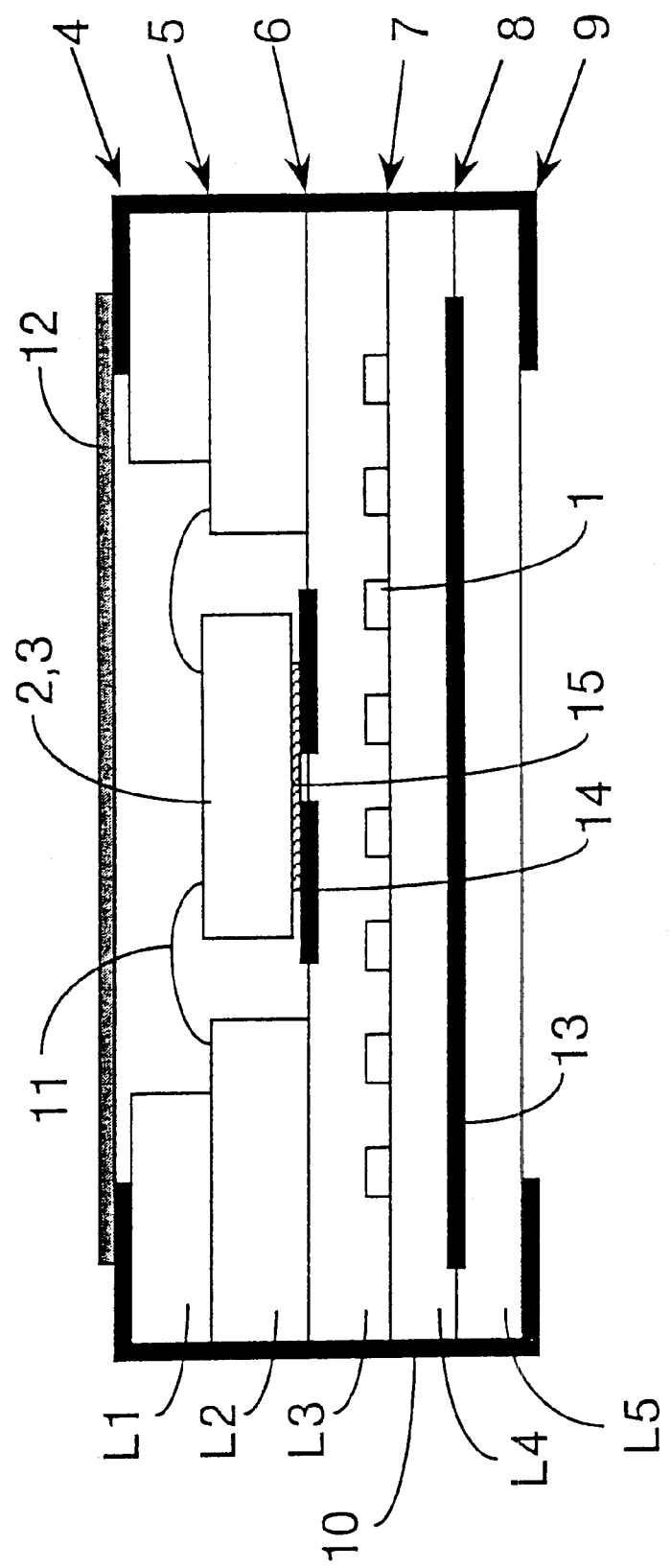
FIG. 4 is a schematic cross sectional view showing a cross sectional structure of an embodiment of the duplexer device according to the invention.

FIG. 4 is a schematic cross sectional view showing a cross sectional structure of an embodiment of the duplexer package having the SAW filters according to the invention. In this embodiment, the duplexer package has a multilayer structure comprising five layers (L1 to L5). While the number of layers constituting the multilayer structure is not particularly limited, it is advantageous that the number of layers is smaller from the standpoint of reduction in height.

Alumina or glass ceramics having a dielectric constant ∈ of about 9.5 is used as a material constituting the respective layers (layers L1 to L5). The line pattern 1 of the matching circuit and the GND pattern 13 are formed among the layers.

In FIG. 4, the upper surface of the layer L1 is referred to as a cap mounting layer 4, the surface of the layer L2 between the layer L1 and the layer L2 is referred to as a wire bonding pad layer 5, the surface of the layer L3 between the layer L2 and the layer L3 is referred to as a die attach layer 6, the surface of the layer L4 between the layer L3 and the layer L4 is referred to as a line pattern layer 7, the surface of the layer L5 between the layer L4 and the layer L5 is referred to as a common GND layer 8, and the lower surface of the layer L5 is referred to as a foot pattern layer 9.

A side castellation 10 is, formed to cover a part of the upper surface of the layer L1, a part of the lower surface of the layer L5 and the side surfaces of the respective layers.

The side castellation is formed to prevent invasion of external noise into the interior of the filter.

The line pattern 1 and the SAW filters are connected to the common terminal T0 and the external connection terminals T1 and T2 through the side castellation 10.

A cap 12 for protecting the filters 2 and 3 inside is arranged on the layer L1 as the uppermost layer. The cap 12 is produced with a metallic material, such as Au plating and Ni plating, or a ceramic material similar to the package.

The layer L1 functions as a frame for mounting the cap 12.

The surface of the layer. L2 is a layer for connecting the terminals on the SAW filters 2 and 3 with the duplexer package, and so-called wire bonding pads are arranged thereon. The pads (terminals) provided on the surface of the wire bonding pad layer 5 (corresponding to the pads WP3, WP5, WP8 and WP10 in FIG. 2) are connected to. the terminals (IN and OUT) on the SAW filters through a wire 11.

The terminals and the interconnection patterns on the surface of the layer L2 are formed by subjecting the surface of an electroconductive material, such as tungsten, Cu and Ag, to an Au plating treatment. The wire 11 can be formed with an appropriate material, such as Al—Si.

The filter chips 2 and 3 are arranged on the surface of the layer L3 (die attach layer 6) by adhesion with a die attach pattern 14 and a paste 15 (electroconductive or non-electroconductive).

The line pattern 1 of the matching circuit is formed on the surface of the layer L4 (line pattern layer 7). While. the line pattern 1 is indicated by eight rectangles in FIG. 4, it is actually one continuous line.

The line pattern is formed on the line pattern layer 7 as an electroconductive pattern having a total length of about $\lambda/4$ and a width of about from 80 to 120 $\mu$m throughout the length. The line pattern is formed on a layer above the common GND layer 8. It may be formed on the layer directly on the common GND layer 8 or may be formed as divided on the plural layers above the common GND layer.

The common GND layer 8 is formed with a GND pattern 13 for shielding except for the pattern section of the side castellation 10 on the side surface for the signal.

The common GND pattern 13 may be formed with tungsten or copper as similar to the line pattern 1.

The materials used as the common GND pattern and the line pattern are necessarily selected with consideration of the baking temperature of the package material.

In the case where alumina is used as the package material, tungsten is preferably used since the baking temperature of alumina is about 1,600° C.

In the case where glass ceramics are used as the package material, on the other hand, copper is preferably used since the baking temperature thereof is about 950° C. Because copper has a lower resistance than tungsten, the insertion loss (transmission intensity) among the frequency characteristics of the duplexer becomes satisfactory.

The exposed part of the GND pattern 13 and the like are preferably subjected to an oxidation preventing treatment, and therefore films of nickel and gold may be formed on copper in this order. Nickel is used herein to improve adhesion property between copper and gold.

The common terminal T0 and the external connection terminals T1 and T2 are provided on the external connection terminal layer (foot pattern layer) 9. These terminals T0, T1 and T2 are electrically connected to the terminals FP5, FP8 and FP2 shown in FIG. 2, respectively, through the side castellation 10.

Figure 5:
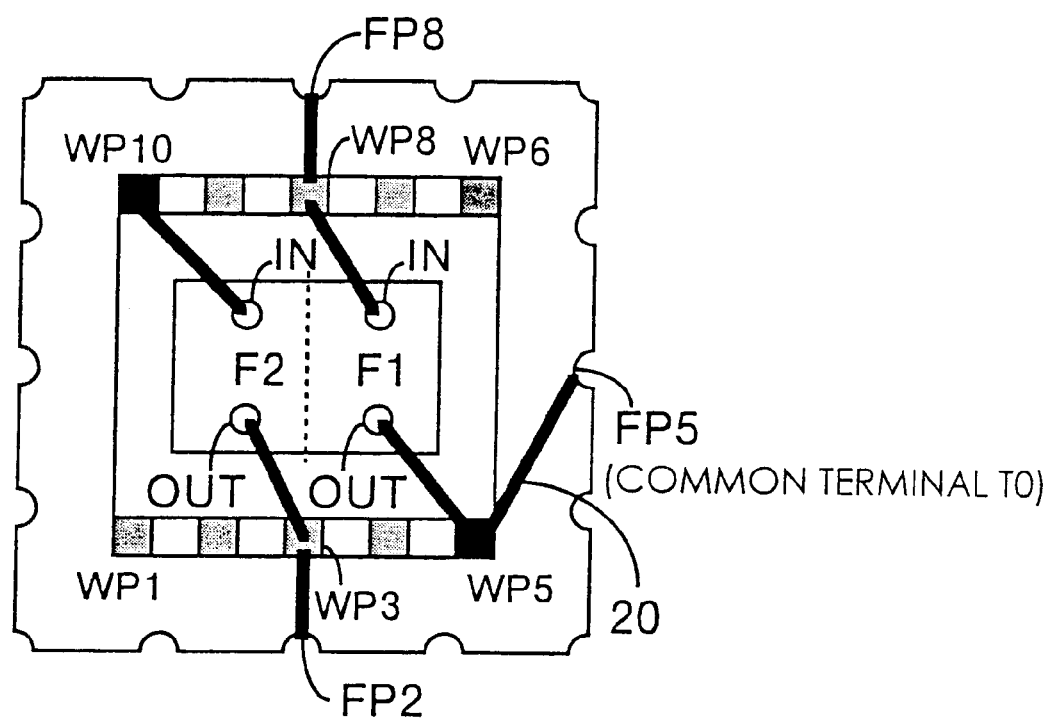
FIG. 5 is a plane view showing a plane structure of a wire bonding pad layer of the duplexer device according to the invention.

FIG. 5 is a plane view from the above showing the duplexer package of this embodiment of the invention.

FIG. 5 is such a plane view that the cap 12 is removed from the cross sectional view shown in FIG. 4 and is to mainly indicate the plane structure of the wire bonding pad layer 5. The figure shows the state where the two surface acoustic wave filter chips F1 and F2, which are formed into one package, are arranged in the cavity in the substantial a center.

That is, the wire bonding pad layer 5 has a rectangular space in the substantial center for mounting the SAW filters. The pads are arranged to surround the rectangular space. While ten pads (WP1 to WP10) are shown in FIG. 5, the number of pads is not limited thereto.

In FIG. 5, the terminals denoted by the symbols starting with FP, the terminals denoted by the symbols starting with WP and OUT and IN of-the filter chips are of the same meaning as in the constitutional blocks shown in FIG. 2.

Figure 6:
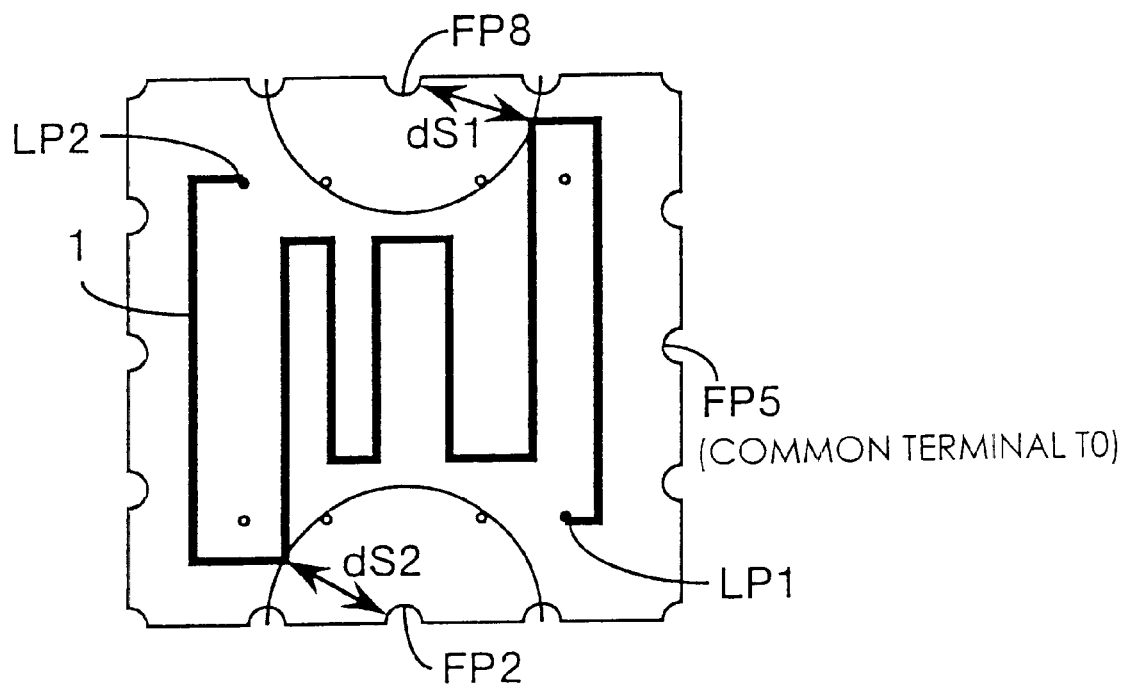
FIG. 6 is a plane view showing a plane structure of a line pattern layer of the duplexer device according to the invention.

FIG. 6 is a plane view showing an embodiment of the pattern shape of the line pattern 1 formed on the line pattern layer 7.

The end LP1 of the line pattern 1 and the pad WP5 in FIG. 5 are electrically connected through a via hole penetrating the layers (the layer L2 and the layer L3), and the end LP2 and the pad WP10 in FIG. 5 are electrically connected through a via hole penetrating the layers (the layer L2 and the layer L3).

The term "electrically connected" will be described. For example, the external connection terminal T1 shown in FIG. 2 is on the foot pattern layer 9, and it is connected to the terminal FP8 shown in FIG. 2 and FIG. 5 on the wire bonding pad layer 5 through the side castellation 10 and is further connected to the wire bonding pad WP8 through an interconnection pattern.

The pad WP8 and the terminal IN on the surface acoustic wave filter chip F1 are connected through the wire 11.

Similarly, the terminal T2 in FIG. 2 is connected to the terminal FP2 in FIG. 5 through the side castellation 10 and is further connected to the pad WP3 through an interconnection pattern, so as to connect to the terminal OUT on the surface acoustic wave filter F2.

The common terminal T0 is connected to the terminal FP5 on the wire bonding pad layer 5 through the side castellation 10 and is further connected to the pad WP5 through a common terminal lead line 20, so as to connect to the terminal OUT on the surface acoustic wave filter F1.

In the duplexer package having such a constitution according to the invention, the external size thereof can be 5.0 (width)×5.0 (length)×1.5 mm (height) in the case of a duplexer for the 800 MHz band.

Since the size of the duplexer package that has been conventionally used in a mobile phone is about 9.5 (width)× 7.5 (length)×2.1 (height), the duplexer package of the invention realizes miniaturization of about 25%.

The size of a duplexer for a 1.9 GHz band can be reduced to about 3.8 (width)×3.8 (length)×1.5 (height), which is about 14% of the size of the conventional duplexer package. In the following examples, the constitution of a duplexer package having a miniaturized size of 5.0×5.0×1.5 mm will be described unless otherwise indicated.

Figure 7:
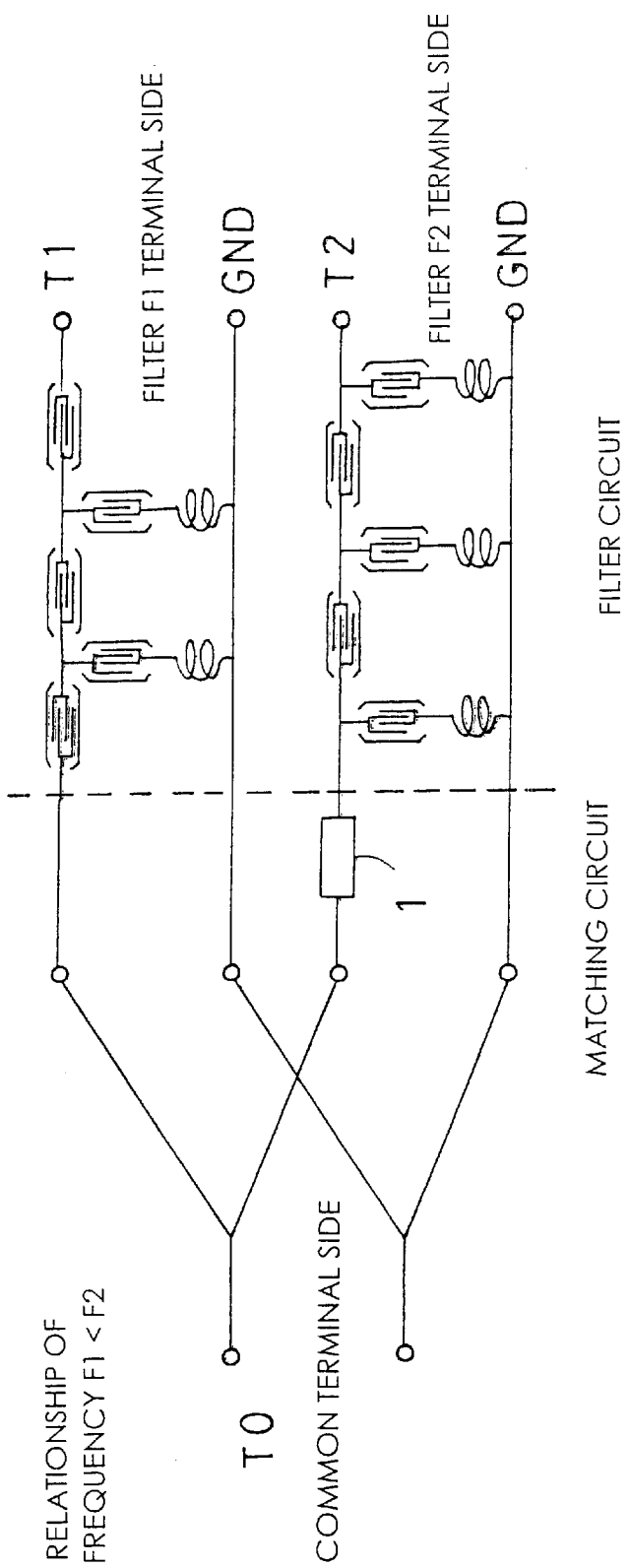
FIG. 7 is a schematic circuit diagram showing the duplexer using ladder type SAW filters according to the invention.

The surface acoustic filter chips 2 and 3 each is of a ladder type design, in which one-port surface acoustic wave resonators are connected in a ladder form (see FIG. 7), and the material for the substrate is LiTaO$_3$ (for example, 42° Y-rot X-propagation). The electrode material is an alloy containing Al as the main component (such as Al—Cu and Al—Mg) and a multi-layer film thereof (such as Al—Cu/Cu/Al—Cu, Al/Cu/Al, Al/Mg/Al and Al—Mg/Mg/Al—Mg) formed by sputtering, which is patterned by exposure and etching.

The positional relationship of the line pattern 1 with the wire bonding pads and the terminals arranged on the wire bonding layer 5, which is one of the characteristic features of the invention, will be described.

In an embodiment of the invention shown in FIG. 5, the pads connected to the both ends (LP1 and LP2) of the line pattern 1 (hereinafter referred to as matching pads) in the wire bonding pad layer 5 are WP5 and WP10, and both the matching pads are arranged at the most distant diagonal corners with the rectangular space for mounting the filter chips intervening therebetween.

In other words, the matching pads WP5 and WP10 are formed at the positions most distant from each other among the pads arranged on the wire bonding pad layer 5. The matching pads WP5 and WP10 are arranged immediately above the ends LP1 and LP2 of the line pattern 1, respectively, so as to electrically connect the matching pads and the ends of the line pattern through the via holes. The pad WP5 is connected to the end LP1, and the pad WP10 is connected to the end LP2.

In FIG. 6, the total length of the line pattern of this embodiment of the invention is about $\lambda/4$ ($\lambda = C/f_o$, $C = C_o/\sqrt{\in}$, $C_o = 3 \times 10^8$ m/s). The total length of the line pattern is determined by the center frequency of the pass band of the filter and the characteristics impedance value of the pattern.

The minimum distance dS1 between the line pattern and the terminal (FP8 in FIG. 6) connected to the external connection terminal T1 on the side of the surface acoustic wave filter F1 in the embodiment of the invention shown in FIG. 6 will be described. In the arrangement of the line pattern 1 shown in FIG. 6, the distance between FP8 and the folded corner becomes the minimum distance dS 1.

Similarly, the minimum distance dS2 between the line pattern and the terminal (FP2 in FIG. 6) connected to the external connection terminal T2 on the side of the surface acoustic wave filter F2 becomes the distance from FP2 to the folded corner shown in FIG. 6. For example, while it is general that dS1≠dS2, it is possible in this embodiment that dS1=dS2=about 1.1 mm. Hereinafter, the two minimum distances dS1 and dS2 are represented by dS.

In other words, the distance dS is defined as the minimum distance that is the distance between the point FP8, at which the path connecting the external connection terminals T1 and T2 on the foot pattern layer 9 with the terminals IN and OUT on the SAW filters intersects the line pattern layer 7, and an arbitrary point on the line pattern 1.

Figure 8:
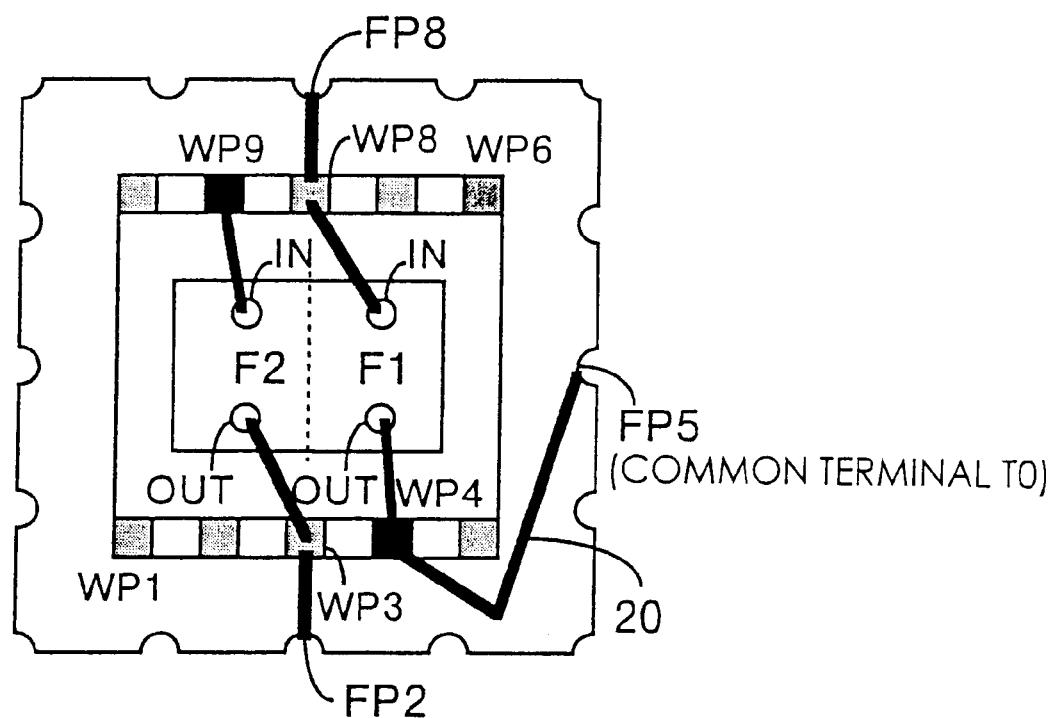
FIG. 8 is a plane view showing a plane structure of a wire bonding pad layer of a duplexer device that is not used in the invention.
Figure 9:
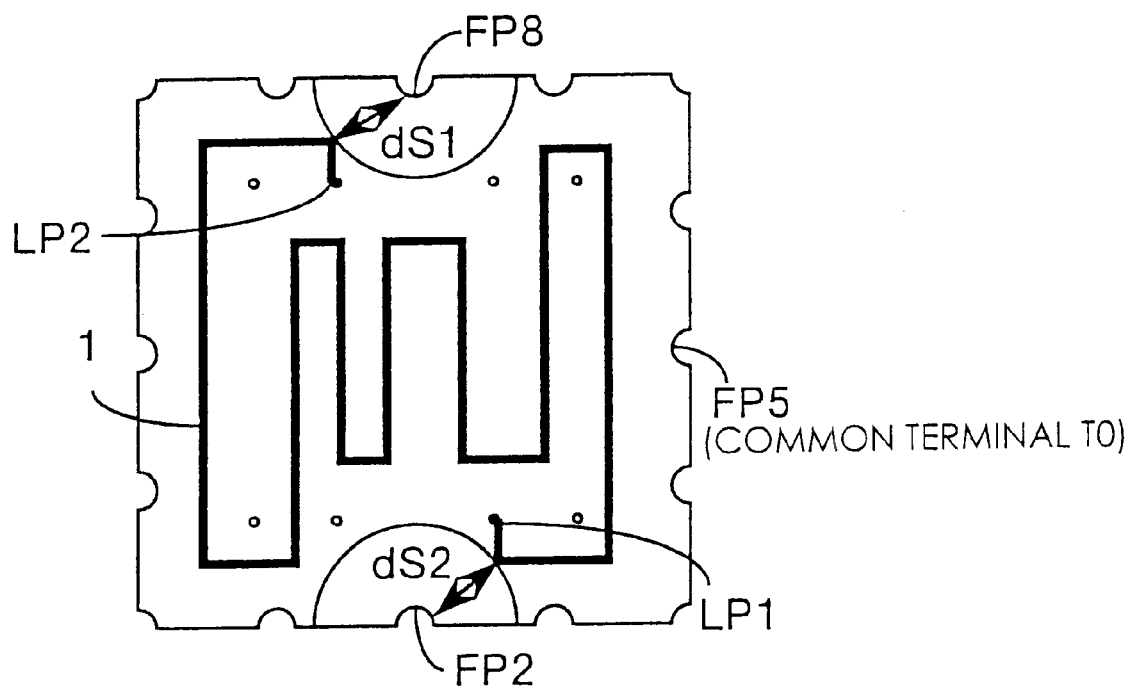
FIG. 9 is a plane view showing a plane structure of a line pattern layer corresponding to FIG. 8.

For comparison, an arrangement of pads and a line pattern that are not used in the invention are shown in FIGS. 8 and 9.

FIG. 8 shows the arrangement of the pads on the wire bonding layer, in which the matching pads connected to the ends LP1 and LP2 of the line pattern 1 are arranged at the positions of WP9 and WP4 inside WP10 and WP5.

When the line pattern 1 is arranged in the form shown in FIG. 9, the minimum distances dS1 and dS2 from the terminals FP8 and FP2 to the line pattern are those shown in the figure.

The total length of the line pattern 1 herein is the same as that shown in FIG. 6. In this case, the minimum distances are, for example, dS1=dS2=about 0.5 mm. Therefore, it is understood that both the minimum distances dS1 and dS2 of the line pattern of the invention shown in FIG. 6 can be larger than those of the line pattern not involved in the invention shown in FIG. 9. As described later, the distances dS1 and dS2 are preferably as long as possible in order to obtain sufficiently isolation, so as to realize good depression characteristics among the frequency characteristics of the duplexer.

In the case shown in FIG. 5, the line 20 connecting the pad WP5 to the connection terminal FP5 to the common terminal T0 can be shorter than the line 20 shown in FIG. 8.

It has been known that the depression characteristics of the duplexer are deteriorated when the isolation between the external connection terminals T1 and T2 and the line pattern 1 is poor. When the distance of them is too short, the isolation is deteriorated to fail to satisfy the desired depression characteristics.

Therefore, in order to obtain desired good depression characteristics of the duplexer, it is preferred that the distance from the external connection terminals T1 and T2 and the terminals FP8 and FP2 connected to the terminals T1 and T2 to an arbitrary point of the line pattern 1 is as large as possible. In other words, the isolation between the external connection terminals T1 and T2 and the line pattern 1 can be improved when the minimum distances dS1 and dS2 are as large as possible.

FIG. 5 shows the case where ten wire bonding pads in total connected to the terminals on the surface acoustic wave filters and the like are arranged, but the arrangement of the ends LP1 and LP2 of the line pattern and the pads connected thereto can be considered other than the two embodiments shown in FIGS. 6 and 9. While possible arrangements will be described later, the minimum distances dS1 and dS2 shown in FIG. 6 can be the longest in the case where the matching pads connected to: the ends LP1 and LP2 of the line pattern are arranged at the diagonal corners with the rectangular space intervening therebetween, and the matching pads are arranged at such positions that the distances to the connection pads FP8 and FP2 to the external connection terminal T1 and T2 becomes the largest, as shown in FIG. 5.

Even when minimum distances dS1 and dS2 that are equivalent to those shown in FIG. 6 can be obtained in other possible arrangements, there are cases where another factor of deteriorating the isolation may arise by the other arrangement of the pattern, for example, the length of the line 20 for connecting the terminal FP5 to the common terminal T0 on the wire bonding layer necessarily becomes long as shown in FIG. 8.

Accordingly, it is preferred to realize good isolation between the line pattern and the external connection terminals in the invention that the matching pads connected to the ends LP1 and LP2 of the line pattern are arranged at such positions that at least satisfy one of the following conditions.

(1) The two matching pads are arranged at the diagonal corners of the rectangular space for mounting the filter chips intervening therebetween on the wire bonding layer, whereby the slant distance between the matching pads are the largest.

(2) The matching pads are arranged at such positions that the slant distances to the connection terminals to the external connection terminals in the wire bonding layer become the largest.

It is more preferred that both the conditions be satisfied.

With respect to the second condition (2), it is preferred that in the line pattern layer 7, the distance dS between the point, which the path connecting the external connection terminals with the terminals on the SAW filters intersects the line pattern layer 7, and an arbitrary point on the line pattern 1 is as large as possible, and in order to satisfy the demanded specification, the distance dS is necessarily at least a prescribed value determined by the specification.

Figure 10:
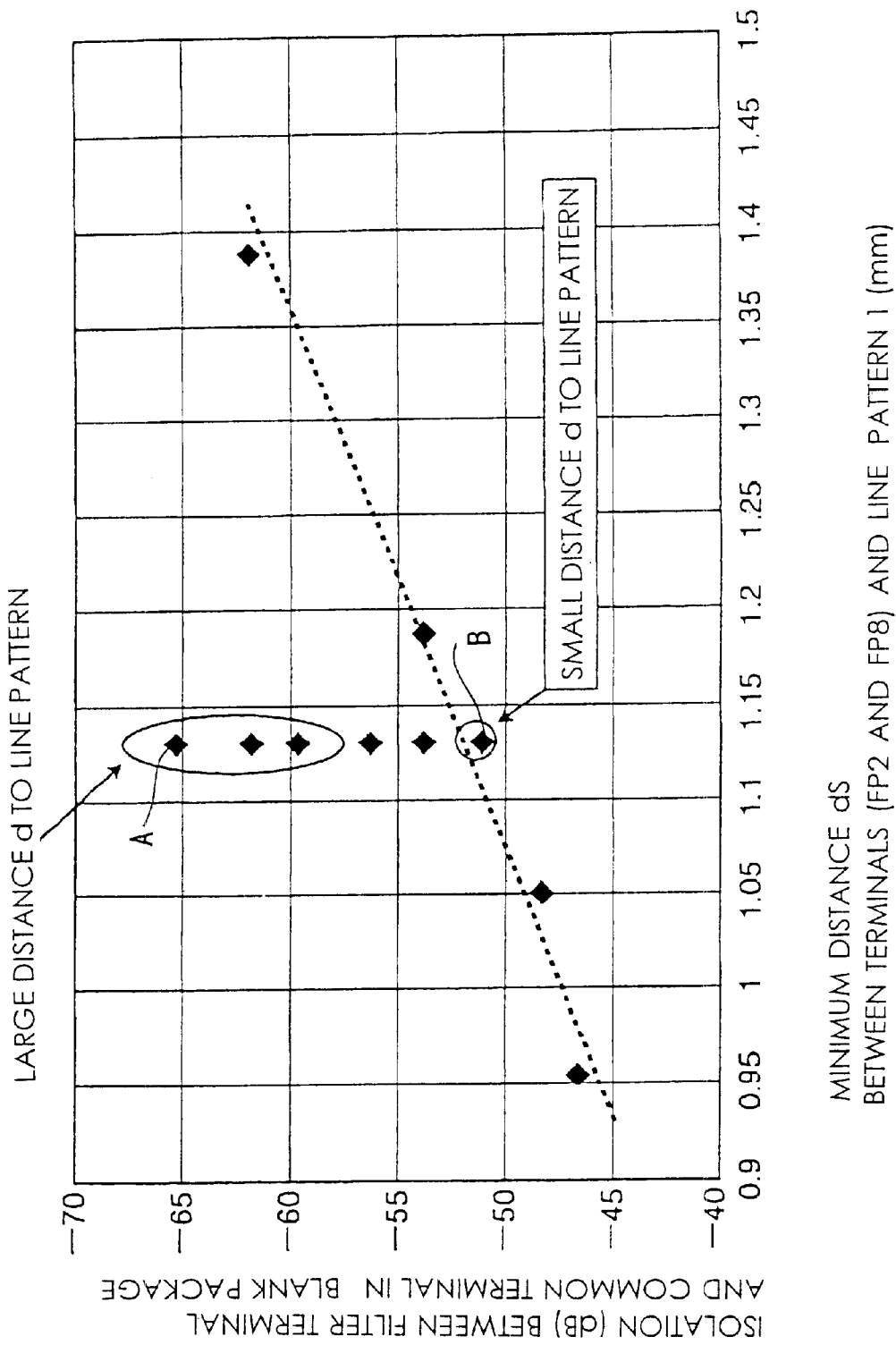
FIG. 10 is a graph showing the relationship between the minimum distance dS and the isolation (dB) in a blank package in the invention.

FIG. 10 is a graph showing the relationship between the minimum distance dS (dS1 and dS2) and the isolation (dB) between the common terminal T0 and the external connection terminals T1 and T2 in a blank package having no filter chip mounted.

Herein, a shorter minimum distance dS (dS1 and dS2) provides poor isolation, whereas a larger minimum distance provides good isolation. For example, when there is a demanded design specification calling for isolation of −50 dB or more, the minimum distance dS (dS1 and dS2) is necessarily 1.075 mm or more.

It has been found that the isolation (dB) varies depending on the arrangement of the line pattern even when the minimum distances dS1 and dS2 are selected to maintain good isolation.

That is, with respect to the distance between the terminals FP8 and FP2 to the line pattern, when the next smallest distance to the minimum distance dS (dS1 and dS2) is referred to "d", it has been found that the isolation (dB) becomes good when the distance d is made as large as possible.

In the graph shown in FIG. 10, the point A indicates the case where the distance d is 1.4 mm, and the point B indicates the case where the distance d is 1.15 mm. According to these, the isolation. (dB) is improved when the distance d is larger.

Figure 12:
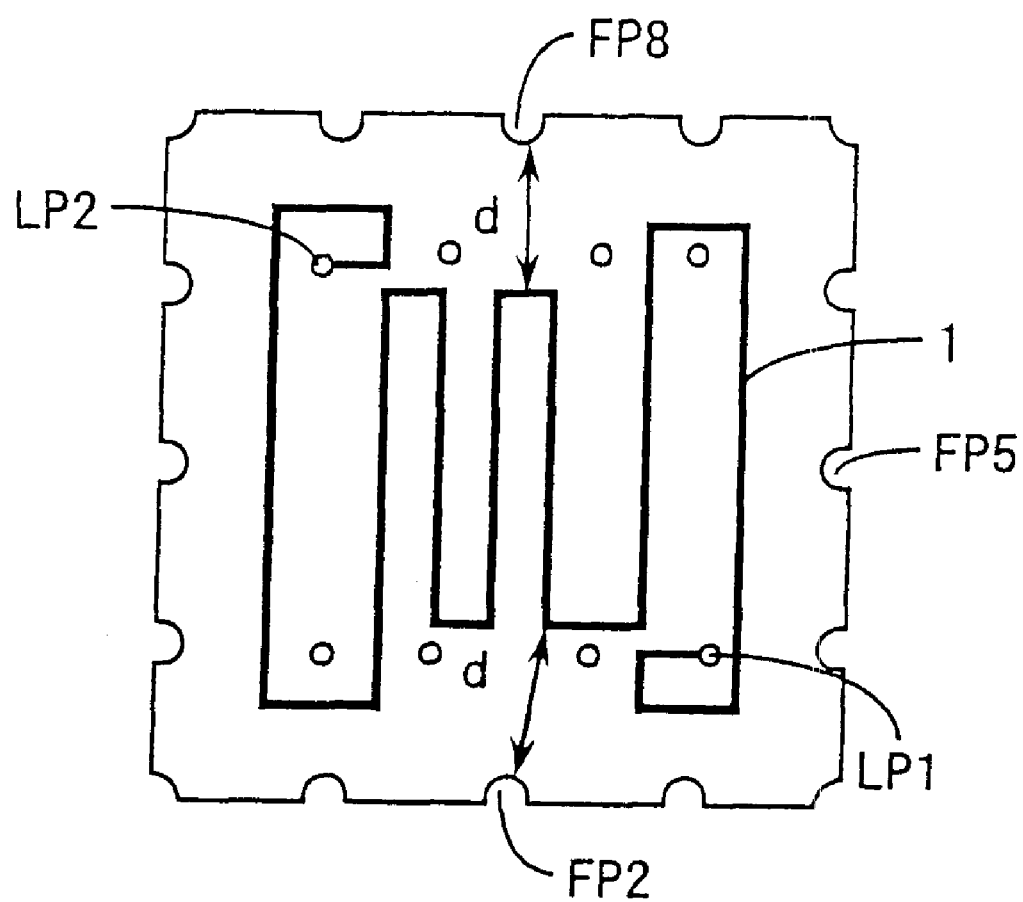
FIG. 12 is an explanatory diagram showing the distance d in an embodiment of the plane. structure of the line pattern layer of the duplexer device .according to the invention.

FIG. 12 is an explanatory diagram showing the second smallest distance d (d>dS1 and dS2) between the terminals FP8 and FP2 connected to the external connection terminals T1 and T2 and the line pattern in an embodiment.

Figure 11:
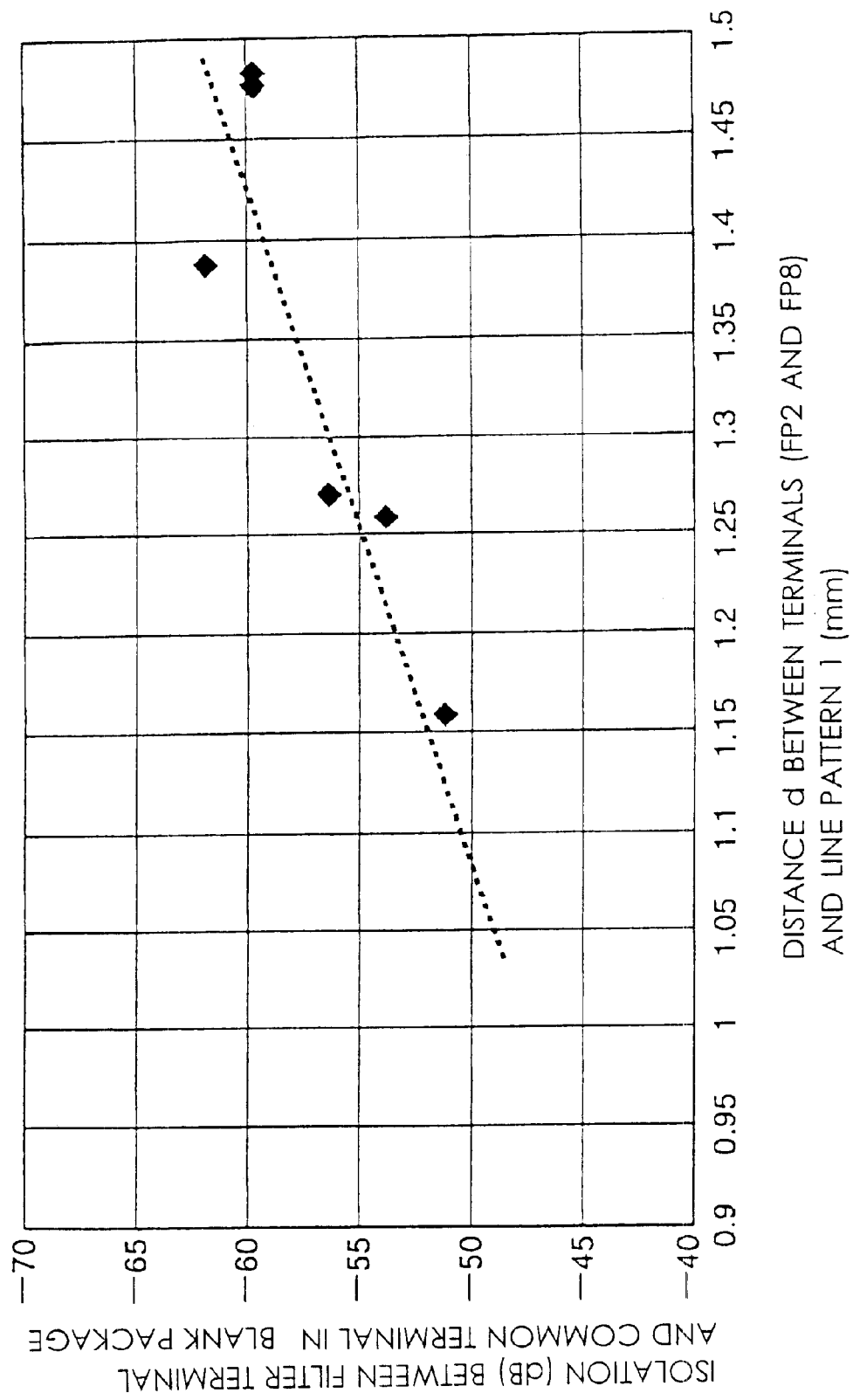
FIG. 11 is a graph showing the relationship between the distance d to the line pattern and the isolation (dB) in a blank package in the invention.

This is a graph showing the isolation with variation of the distance d (d>dS1 and dS2) in the case shown in FIG. 11 where the minimum distances dS1 and dS2 are 1.13 mm.

According to FIG. 11, the graph extends in a substantially straight line, and the isolation is poor when the distance d is smaller but is good when it is larger.

For example, in order to obtain isolation of −50 dB or more, the line pattern is necessarily arranged to provide a distance d of 1.075 mm or more.

The filter characteristics, i.e., the frequency (MHz) pass intensity (dB), of the duplexer package will be described.

Figure 13:
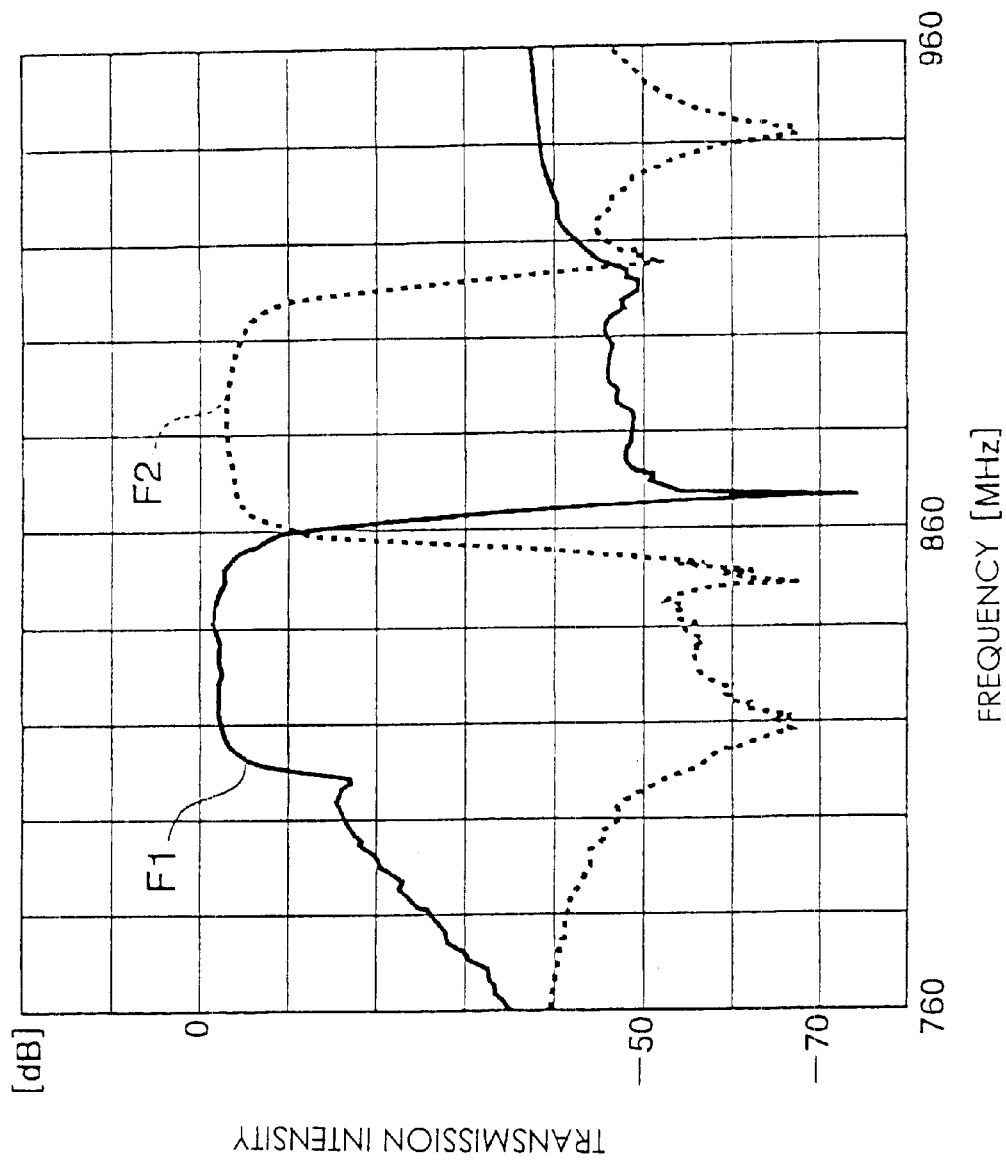
FIG. 13 is a graph showing frequency characteristics of an embodiment of a conventional duplexer device.

FIG. 13 is a graph showing the filter characteristics of the duplexer package having been conventionally used. The conventional duplexer package has a size of 9.5 mm (width)×7.5 mm (length)×2.1 mm (height), which is considerably larger than the duplexer package according to the invention.

Figure 14:
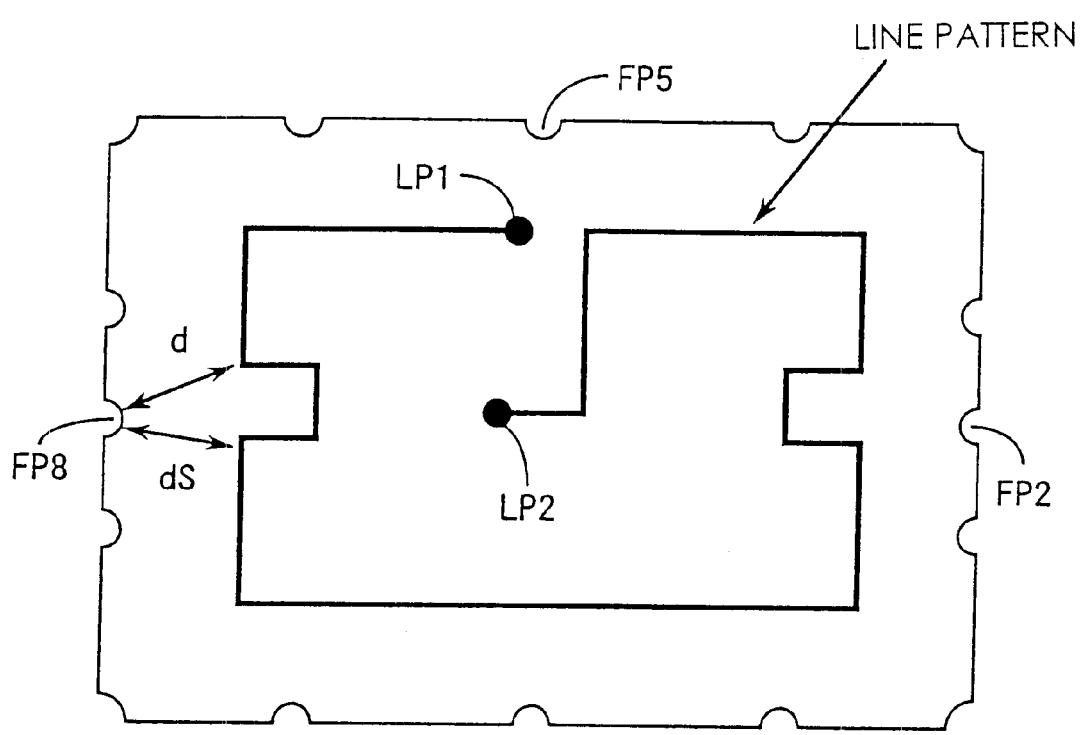
FIG. 14 is a schematic plane view of a plane structure of a line pattern of the conventional duplexer device shown in FIG. 13.

FIG. 14 is a plane view showing a line pattern 1 of a line pattern layer 7 of the conventional duplexer package.

In FIG. 14, the distances dS and d between the terminal connected to the external connection terminal T1 of the filter F1 and the line pattern 1 are 1.5 mm and 1.6 mm, respectively, which are larger than the case of the invention.

This is because the size of the conventional duplexer package is certainly larger than the invention, and the distances dS and d can be made large. In other words, the conventional product exhibits sufficient isolation, i.e., a depression degree on the transmission filter of −52 dB and the depression degree on the reception filter of −46 dB as shown in FIG. 13, but the size of the duplexer package is large as the compensation thereof.

Figure 15:
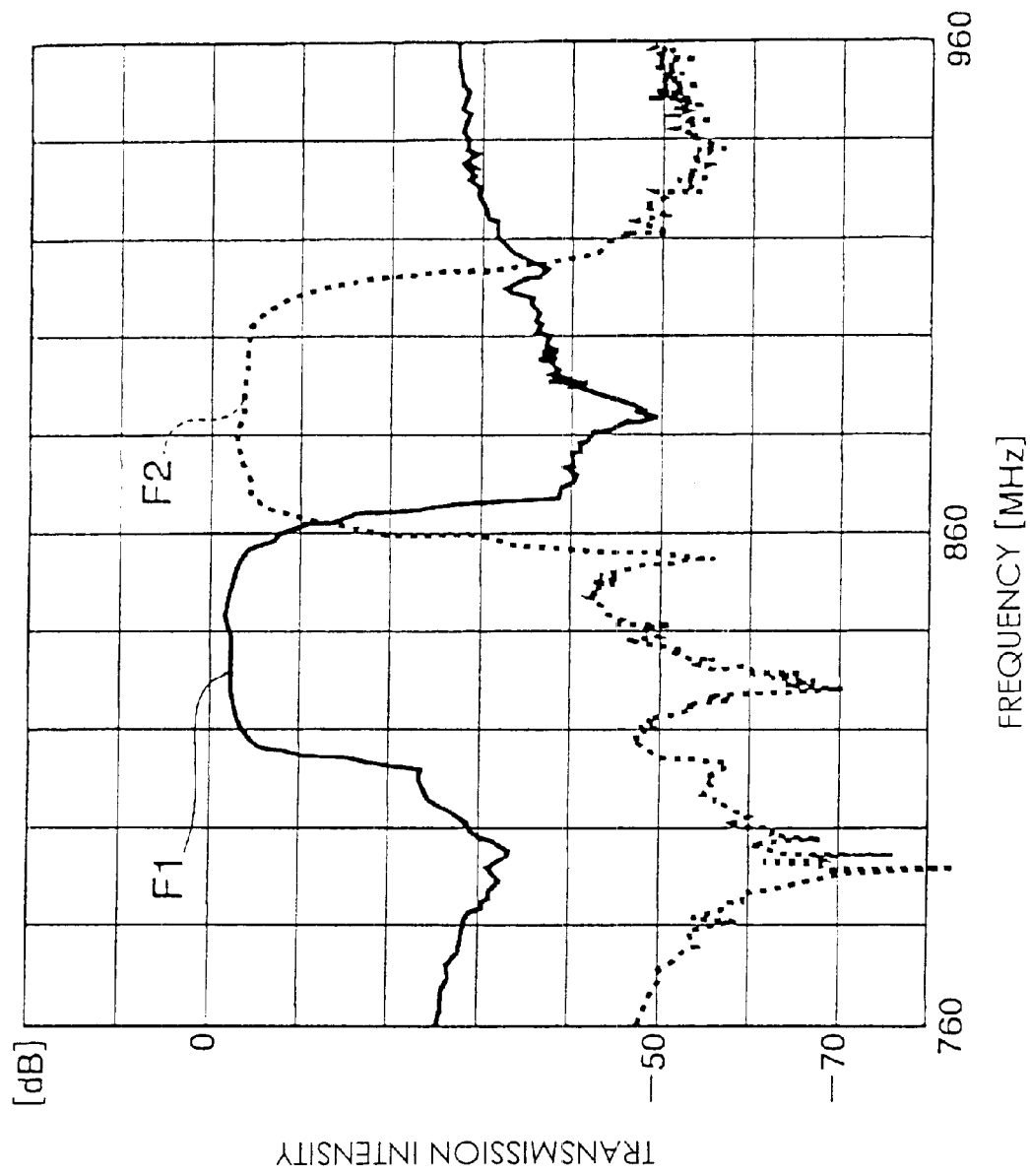
FIG. 15 is a graph showing frequency characteristics of a duplexer device in the case where a pad connected to a line pattern is not arranged in an optimum manner.
Figure 16:
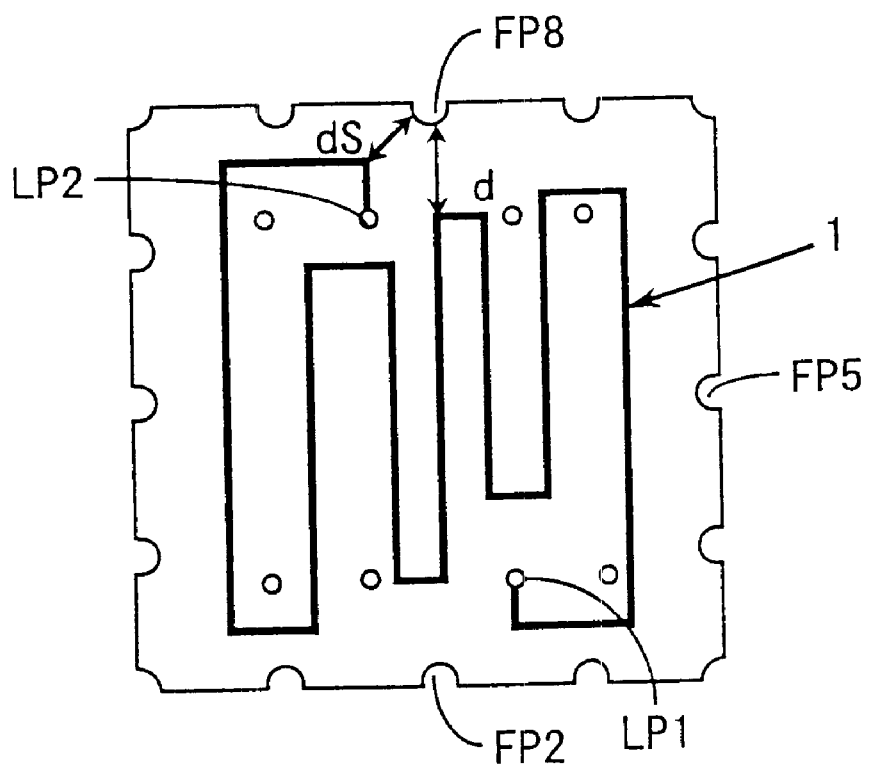
FIG. 16 is a plane view showing a plane structure of a line pattern layer in the case where a pad connected to a line pattern is not arranged in an optimum manner.

FIG. 15 and FIG. 16 are a graph showing frequency characteristics and a plane showing a line pattern shape of a line pattern layer of a duplexer device in that the size of the duplexer package is the same as the duplexer package of the invention (5 mm (width)×5 mm (length)), but the optimum arrangement of the wire bonding pads is not considered.

In FIG. 16, the distances dS and d between the terminal FP8 connected to the external connection terminal T1 and the line pattern 1 are 0.5 mm and 0.6 mm, respectively, which are considerably smaller than the case shown in FIG. 6 according to the invention.

In FIG. 15, the depression degree on the transmission filter side is ×42 dB, and the depression degree on the reception filter side is −37 dB, which are considerably deteriorated in comparison to the conventional product shown in FIG. 13. In other words, in the embodiment shown in FIG. 16, the isolation is insufficient due to the small distances dS and d to provide poor depression degrees outside the pass band even though the package is miniaturized.

The filter characteristics of the duplexer package according to the invention will be described below.

Figure 17:
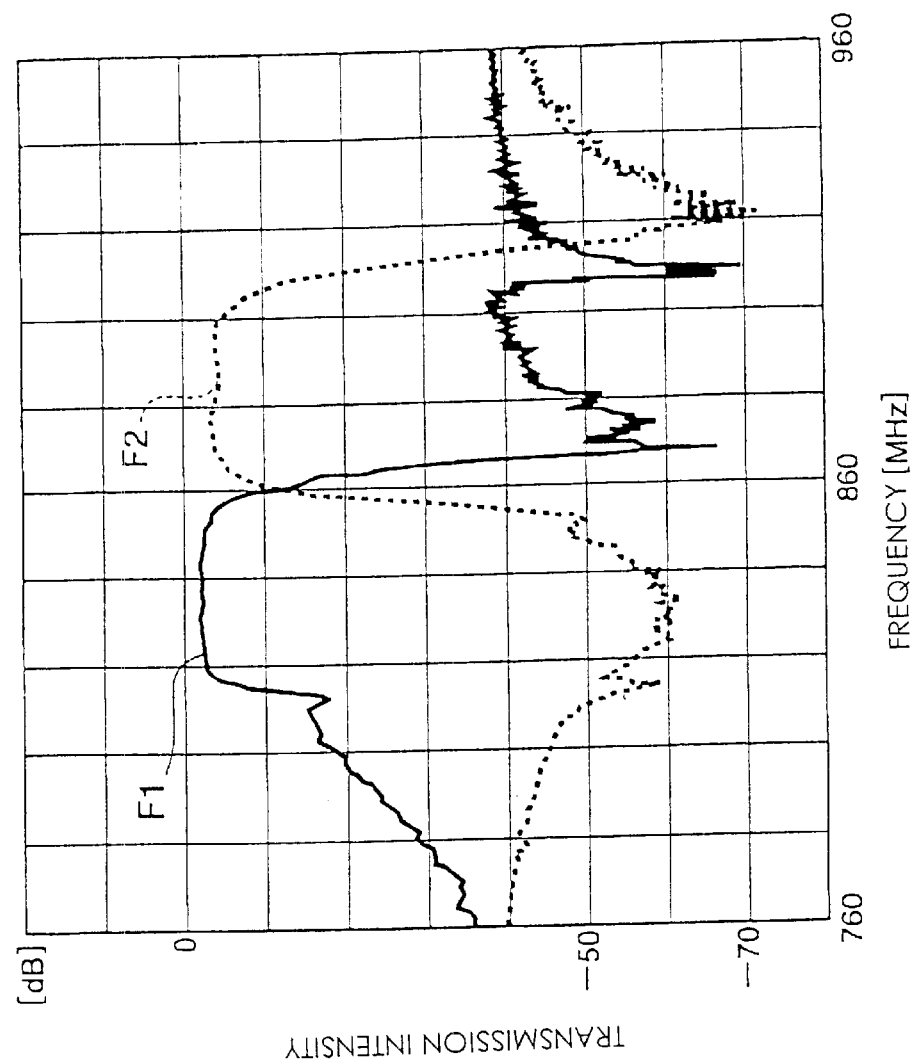
FIG. 17 is a graph showing frequency characteristics of an embodiment of the duplexer device according to the invention.

FIG. 17 is a graph showing filter characteristics of the duplexer device according to the invention, in which the arrangement of the pads is considered as shown in FIG. 5.

Figure 18:
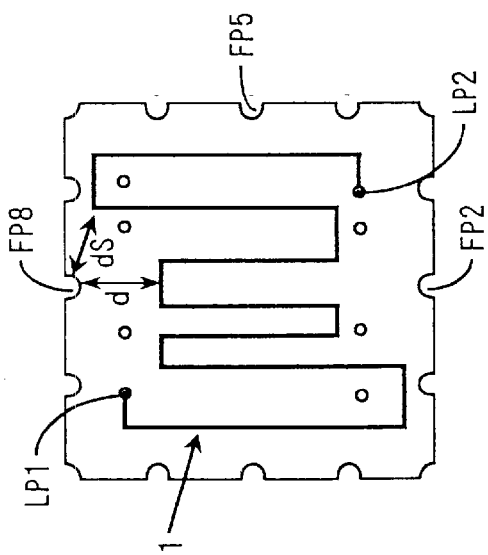
FIG. 18 is a plane view showing a plane structure of an embodiment of the line pattern layer according to the invention.

FIG. 18 is a plane view showing the plane structure of the line pattern layer 7 corresponding to the embodiment shown in FIG. 17. Herein, the distance dS is 0.9 mm, the distance d is 1.2 mm, and the size of the duplexer package is 5 mm×5 mm×1.5 mm.

According to FIG. 17, the depression degree on the transmission filter is −47 dB, and the depression degree on the reception filter is −39 dB, which are poor in comparison to the conventional product shown in FIG. 13, but are good in comparison to the embodiment shown in FIG. 15, in which only the size of the duplexer package is simply miniaturized.

Accordingly, when the sizes of the duplexer packages is constant, the isolation is improved when the arrangement of the wire bonding pads is considered to make the distances dS and d larger as in FIG. 18, whereby the depression degree is improved.

Figure 20:
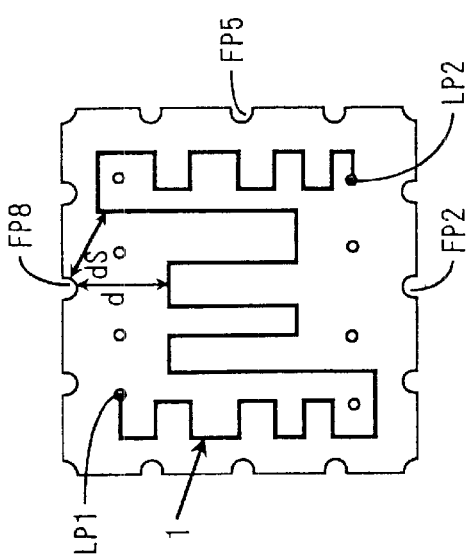
FIG. 20 is a plane view showing a plane structure of an embodiment of the line pattern layer according to the invention.
Figure 19:
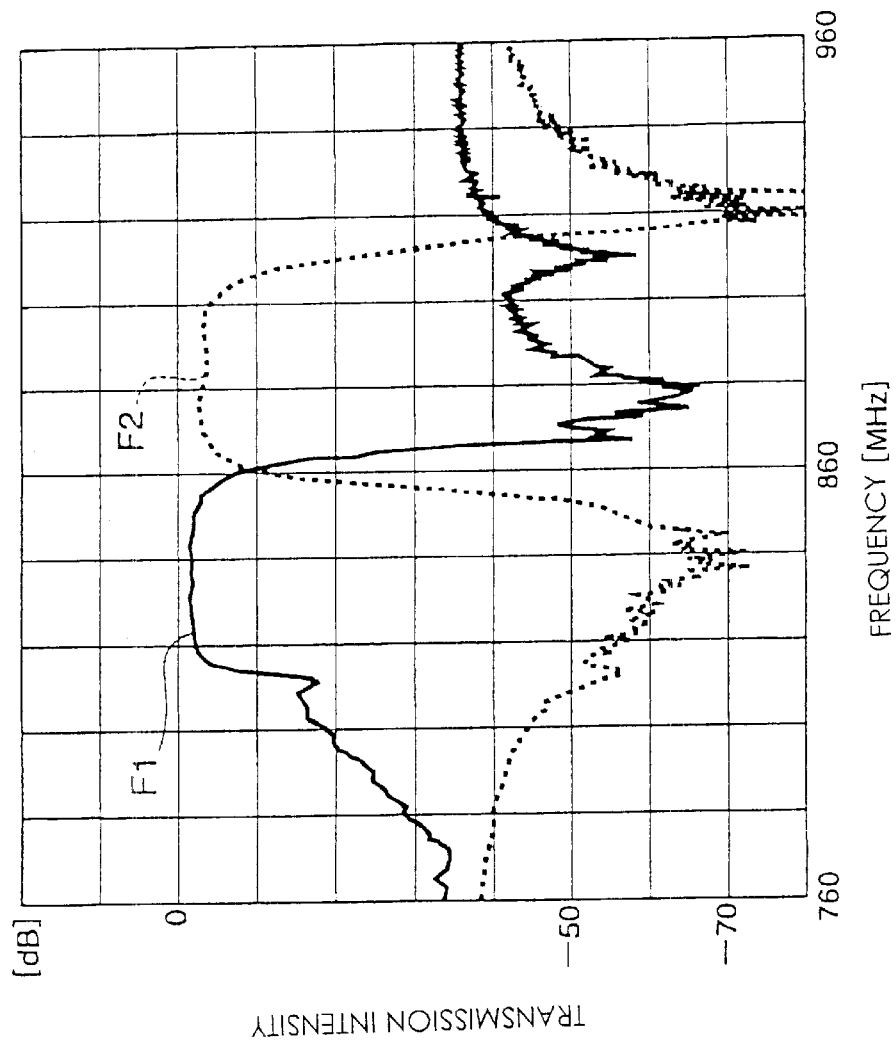
FIG. 19 is a graph showing frequency characteristics of an embodiment of the duplexer device according to the invention.

FIGS. 19 and 20 show an embodiment of the invention where the distances dS and d are made further larger than the case of FIG. 18.

FIG. 19 is a graph showing the filter characteristics of the duplexer package according to the invention, and FIG. 20 is a plane view showing the pattern shape of the line pattern where the distances dS and d are larger while the total length of the line pattern is 35 mm, which is the same as the case of FIG. 18.

Herein, the minimum distance dS is, 1.1 mm, the distance d is 1.4 mm, and the size of the duplexer package is 5 mm×5 mm×1.5 mm.

According to FIG. 19, the depression degree on the transmission filter is −55 dB, and the depression degree on the reception filter is −43 dB. It is understood that the depression degree is largely-improved in comparison to the duplexer packages shown in. FIGS. 15 and 17, and the depression degree on the transmission filter is better than the conventional product shown in FIG. 13.

That is, when the distances dS and d are made large in the miniaturized duplexer package as shown in FIG. 20, the isolation is improved and the depression degree is increased.

As understood from the foregoing description, according to the embodiments of the invention, when the line pattern is arranged in such a manner that the minimum distances dS1 and dS2 and the distance d are 1.075 mm or longer and the minimum distances dS1 and dS2 satisfy the foregoing conditions, a duplexer package having sufficient isolation and good depression degrees can be obtained.

Other embodiments of the invention where the isolation is improved will be described below.

In the embodiment of the invention shown in FIG. 4, the line 20 (which is hereinafter referred to as a common terminal lead line) connecting the connection terminal FP5 to the common terminal T0 and the pad WP5 is present on the wire bonding pad layer 5 (see FIG. in this case, the layer having the line pattern 1 formed (i.e., the line pattern layer 7) and the layer having the common terminal lead line 20 formed (i.e., the wire bonding pad layer 5) are different from each other.

An embodiment is to be considered where the common terminal lead line 20 is formed on the layer 7 having the line pattern 1 formed. An embodiment of the pattern shape of the line pattern layer 7 in this case is shown in FIG. 26.

Figure 26:
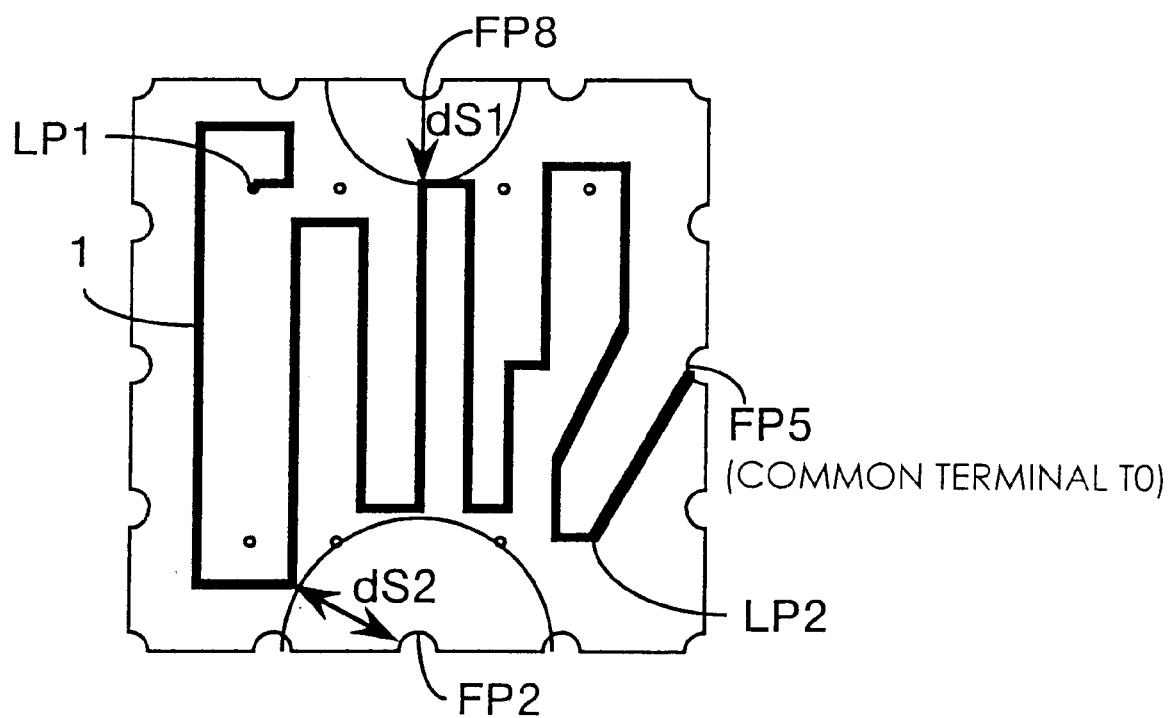
FIG. 26 is a plane view showing a plane structure where a line pattern and a common lead line are formed on the same layer (line pattern layer).

In the embodiment of FIG. 26, since the common terminal lead line 20 is provided on the same layer as the line pattern, the line pattern is necessarily arranged without margin, and therefore the minimum distance dS, and the distance d cannot be large. In this case, the distance dS is smaller than the case of FIG. 6 by about 0.18 mm.

Figure 27:
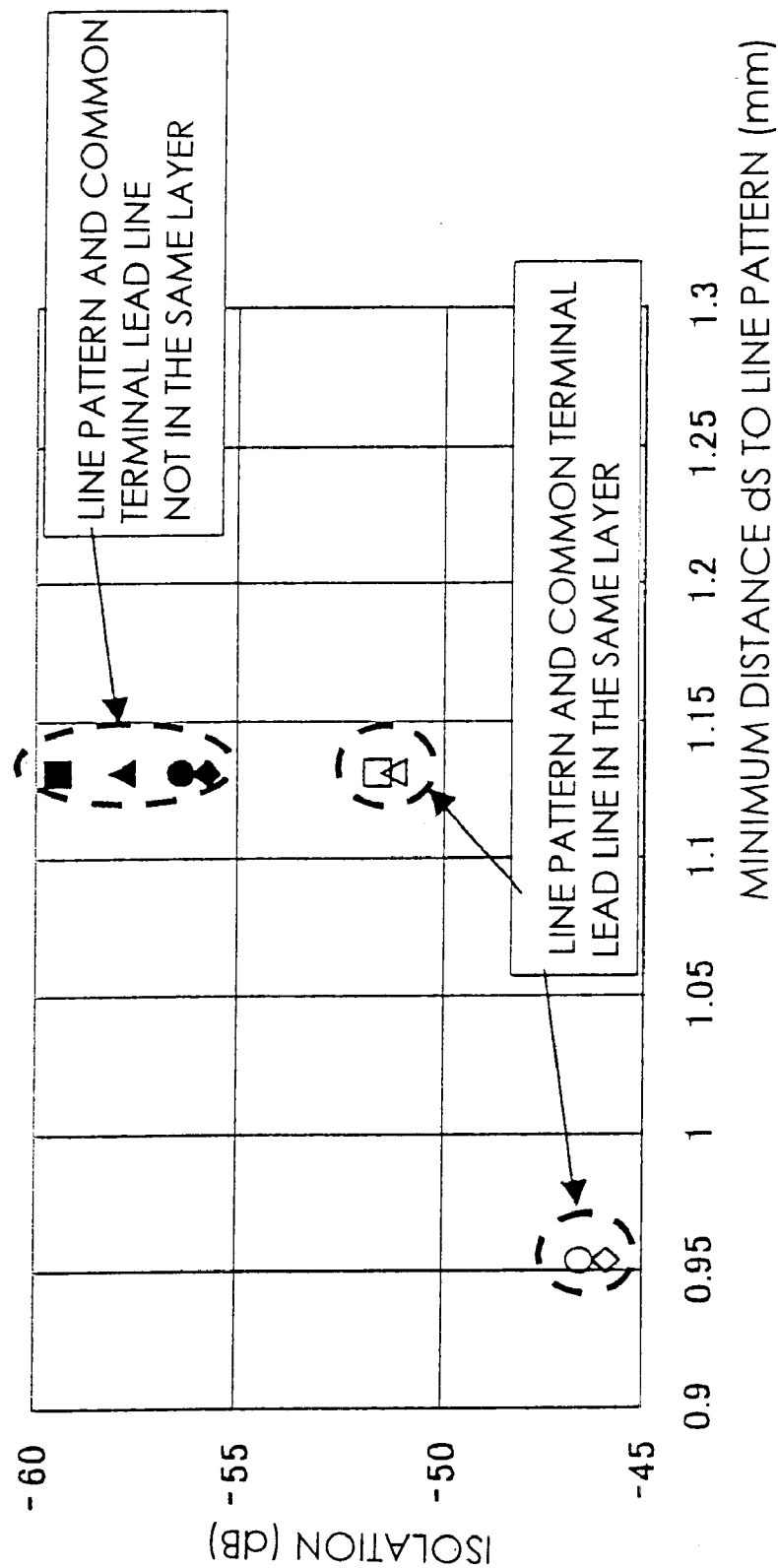
FIG. 27 is a graph showing the relationship between the minimum distance dS and the isolation (dB) in a blank package in the invention.

FIG. 27 is a graph showing the relationship between the distance dS and the isolation characteristics when the pattern is arranged in the manner shown in FIG. 26.

In FIG. 27, the black spots indicate the isolation characteristics of the case shown in FIG. 4, and the white spots indicate the isolation characteristics of the case shown in FIG. 26. The isolation is better in the case where the line pattern 1 and the common terminal lead line 20 are not present in the same layer (black spots) than the case where they are present in the same layer by about from 6.7 to 9.9 dB, and the depression degree is also good. Therefore, it is preferred that the line pattern 1 and the common terminal lead line 20 are formed on different layers.

While the embodiment shown in FIG. 4 ensures isolation of −50 dB or more, the isolation can be further improved by providing another layer, i.e., a common terminal lead line layer, below the GND layer 8. This is because it is considered that the common terminal lead line 20 influences the isolation characteristics.

Another embodiment of the duplexer package according to the invention is shown in FIG. 21.

In this embodiment, a common terminal lead line layer 21 is provided below the common GND layer 8 as different from FIG. 5. The pattern shape of the line pattern 1 is the same as in FIG. 6.

Figure 22:
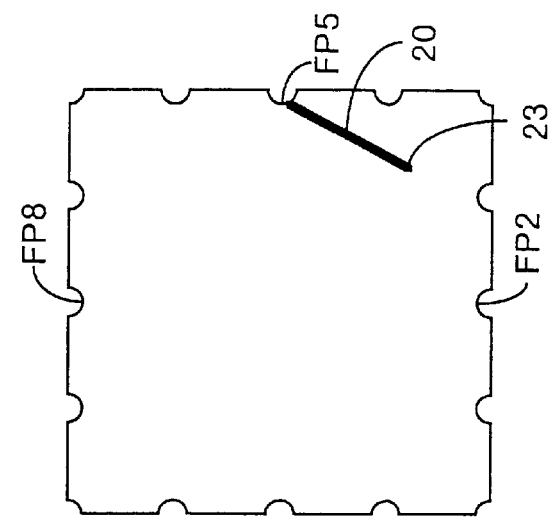
FIGS. 22($a$), 22($b$) and 22($c$) are plane views showing plane structures of respective layers of the duplexer device according to the invention shown in FIG. 21.
Figure 22:
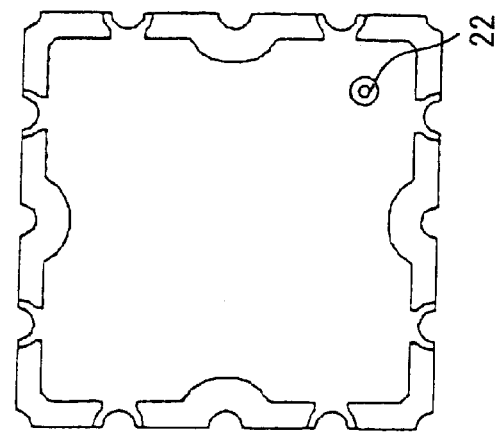
Figure 22:
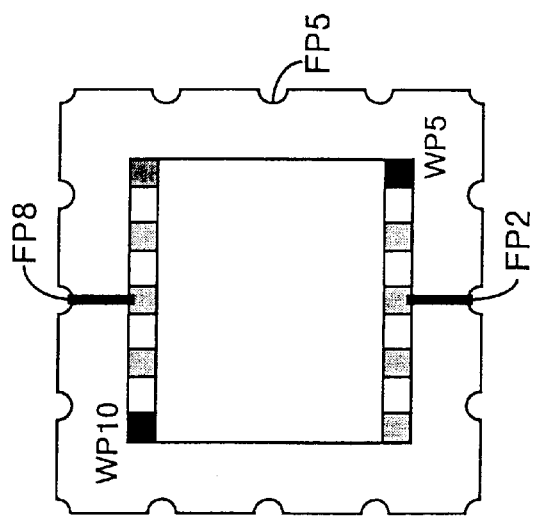

FIGS. 22A, 22B and 22C are plane views showing the surface patterns of the wire bonding pad layer 5, the common GND layer 8 and the common terminal lead line layer 21, respectively.

In FIGS. 22A, 22B and 22C, a pad WP5 of the wire bonding pad layer 5 and an end 23 of the common terminal lead line 20 on the common terminal lead line layer 21 are electrically connected through a via hole (at the position 22 on the common GND layer 8) penetrating the layers.

Figure 23:
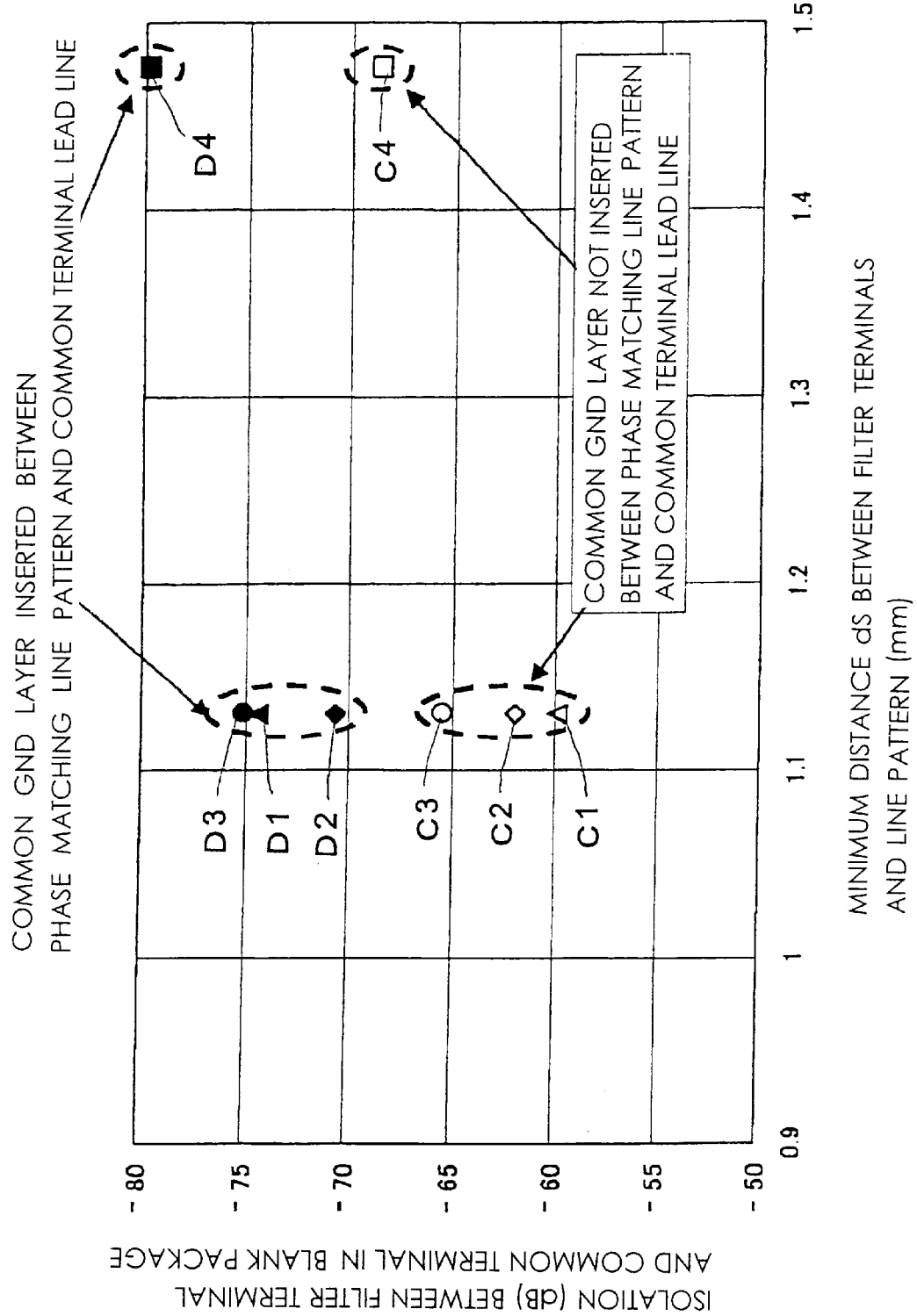
FIG. 23 is a graph showing the relationship between the minimum distance dS and the isolation (dB) in a blank package in the invention.

FIG. 23 is a graph showing the relationship between the isolation and the minimum distance dS of a blank package of the duplexer of the invention having the constitution shown in FIG. 21.

The white spots (C1 to C4) in FIG. 23 indicate the case where the common GND layer 8 does not intervene between the line pattern 1 and the common terminal lead line 20 (see FIG. 4), and the black spots (D1 to D4) in FIG. 23 indicate the case where the common GND layer 8 is provided between the line pattern 1 and the common terminal lead line layer 21 in FIG. 21.

It is understood from FIG. 23 that since the common terminal lead line layer 21 is provided below the common GND layer 8, the isolation is improved by about from 9 to 14 dB in comparison to the case where the common terminal lead line layer 21 is not provided.

Figure 24:
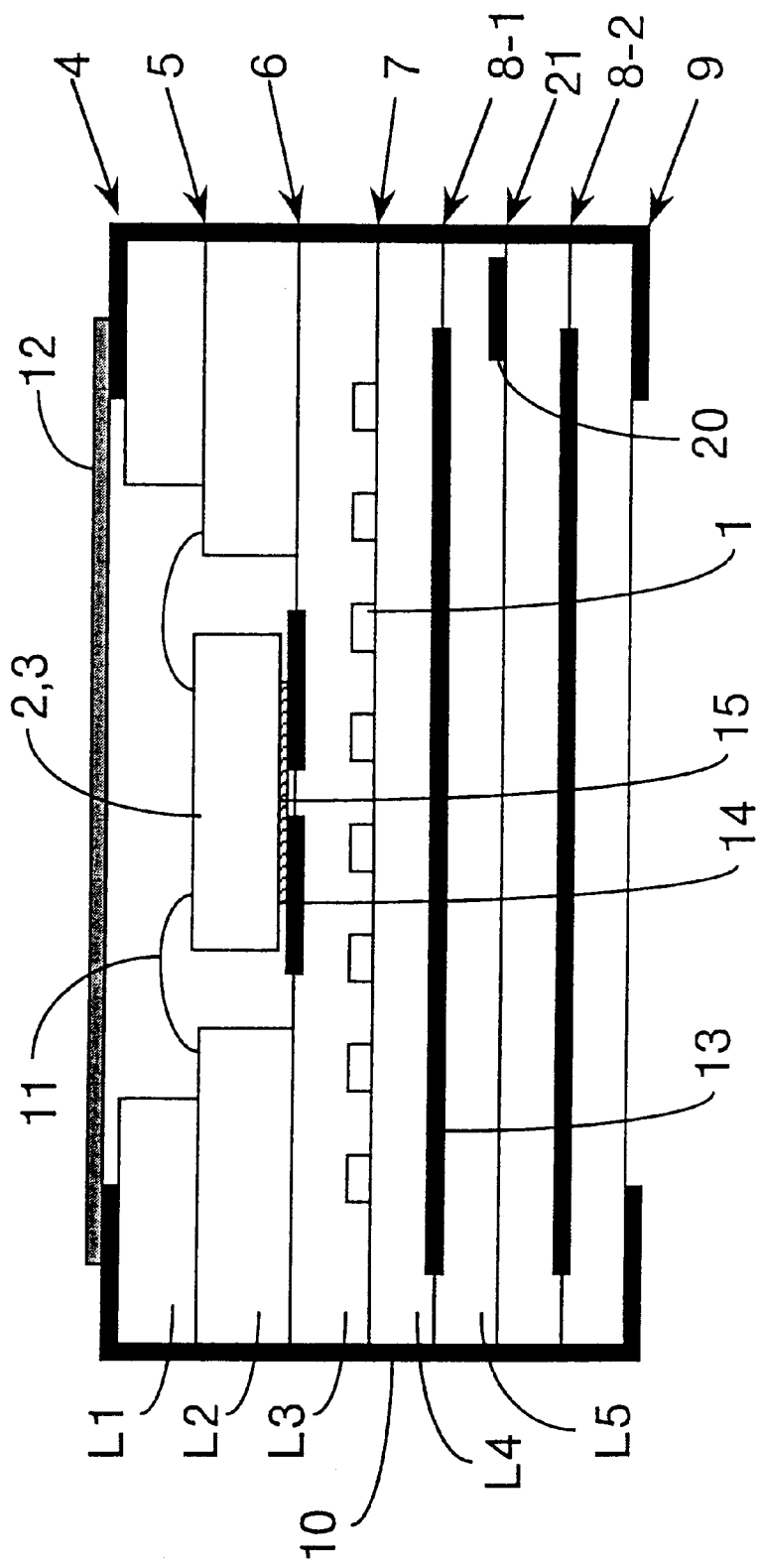
FIG. 24 is a schematic cross sectional view showing a cross sectional structure of an embodiment of the duplexer device according to the invention.

Furthermore, as shown in FIG. 24, common GND layers 8-1 and 8-2 may be formed to sandwich the common terminal lead line layer 21.

Figure 25:
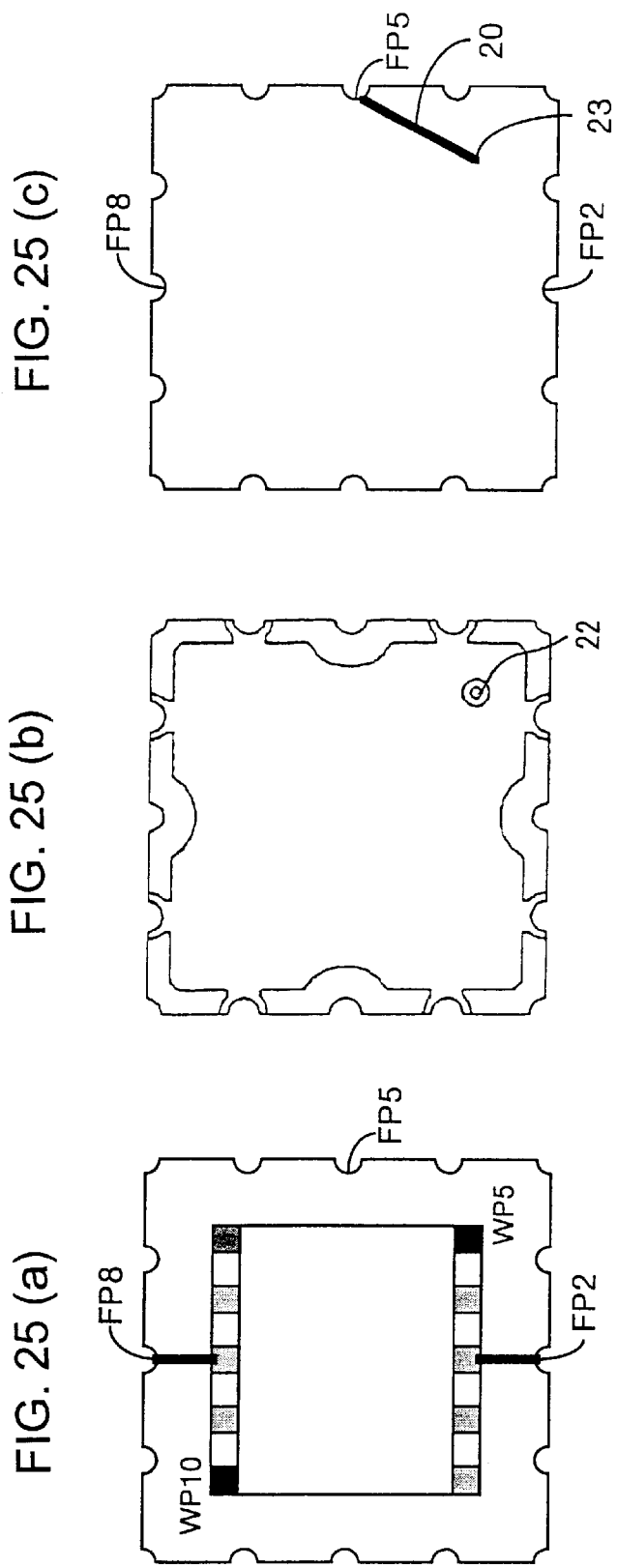
FIGS. 25($a$), 25($b$) and 25($c$) are plane views showing plane structures of respective layers of the duplexer device according to the invention shown in FIG. 24.

FIGS. 25A, 25B and 25C are plane views showing the surface patterns of the wire bonding pad layer 5, the common GND layer 8-1 and the common terminal lead line layer 21, respectively. In this case, the pad WP5 and the end 23 of the common terminal lead line 20 are electrically connected through a via hole (at the position 22) penetrating the layers.

According to the embodiment, since the common terminal lead line layer 21 is sandwiched and shielded by the two common GND layers 8-1 and 8-2, the isolation can be further improved by about from 3 to 5 dB.

As still another embodiment of the invention, the line pattern of the matching circuit is not formed on one layer but is formed as divided into plural layers. Since the lengths of the line patterns in the respective layers can be short by dividing the line pattern into plural layers, the distances dS and d can be made large, and therefore the isolation can be improved. However, in the case where the line pattern is divided into plural layers, it is preferred that the arrangements of the line patterns of the layers are differentiated from each other in order to prevent interference of the line patterns of the layers.

Four wires are used to connect the terminals (IN and OUT) of the filter chips and the wire bonding pads, and when the wires are present too closely to each other, the depression degree among the filter characteristics is deteriorated due to interference thereof.

Therefore, it is necessary that the positions of the wire bonding pads are determined under consideration that the distances among the wires becomes as large as possible.

From the standpoint of the wires, because the wires from the filter chips are connected to WP3 and WP5 in the embodiment of the invention shown in FIG. 5, it is preferred since the distance between the wires is larger than the embodiment shown in FIG. 8 where the wires are connected to the pads WP3 and WP4 adjacent to each other.

Figure 28:
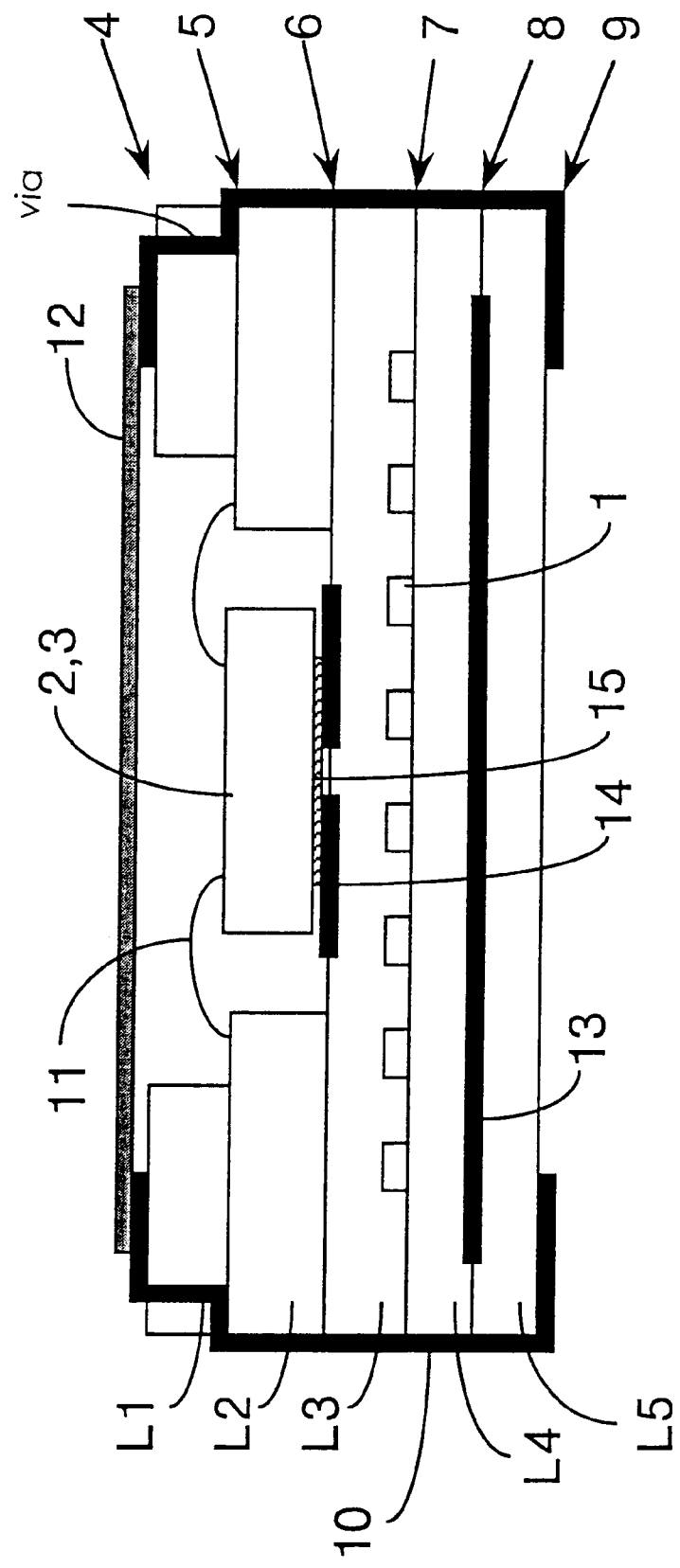
FIG. 28 is a schematic cross sectional view showing a cross sectional structure of an embodiment of the duplexer device according to the invention.

While the entire outer layer of the package is covered with the GND to prevent influence of external noise to the filter chips and the matching circuit in the embodiment shown in FIG. 4, it is also possible as shown in FIG. 28 that a cap mounting layer 4 and the GND section of the wire bonding pad layer 5 are connected through via holes provided in the layer L1. Invasion of external noise into the internal pattern can be prevented by the structure.

In the case where the filter chips are mounted on the die attach pattern 14 on the die attach layer 6 through an electroconductive paste 15, the die attach pattern 14 is preferably formed to have divided patterns rather than one solid film from the standpoint of impedance matching of the matching circuit.

The die attach pattern 14 is a GND pattern that is connected to the GND pattern of the foot pattern layer 9 as the lowermost layer through the side castellation 10.

FIGS. 29A and 29B are plane views showing the pattern shapes of the die attach layer 6 that have been conventionally used. FIG. 29A shows the case where the die attach pattern 14 is formed as one solid film pattern, and FIG. 29B shows the case where the electroconductive paste 15 is coated on the die attach pattern 14.

FIGS. 30A and 30B are plane views showing the pattern shapes of the die attach layer used in the invention. FIG. 30A shows the case where the die attach pattern 14 is divided into four pieces. FIG. 30B shows the case where the electroconductive paste 15 is coated on the die attach pattern 14 divided into four pieces.

Figure 31:
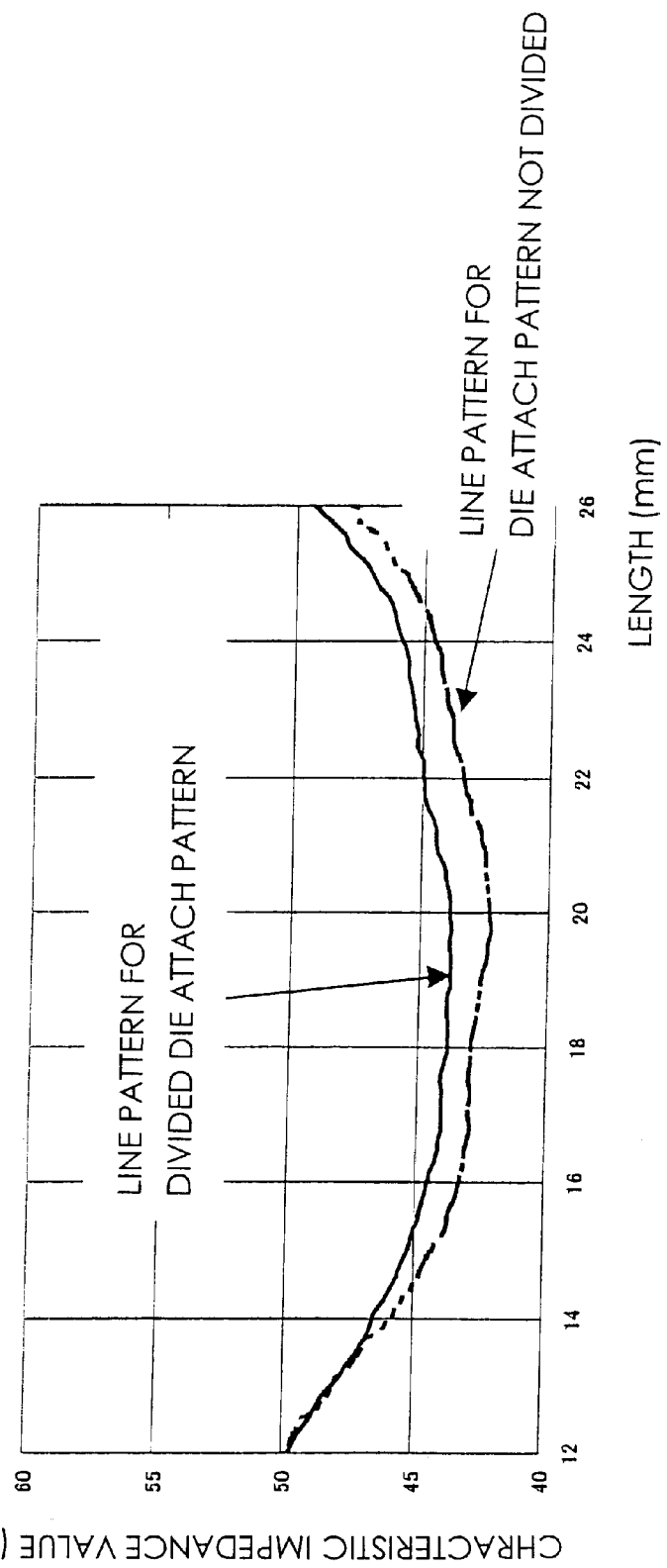
FIG. 31 is a graph showing a resistance value of a line pattern in the die attach layer.
Figure 32:
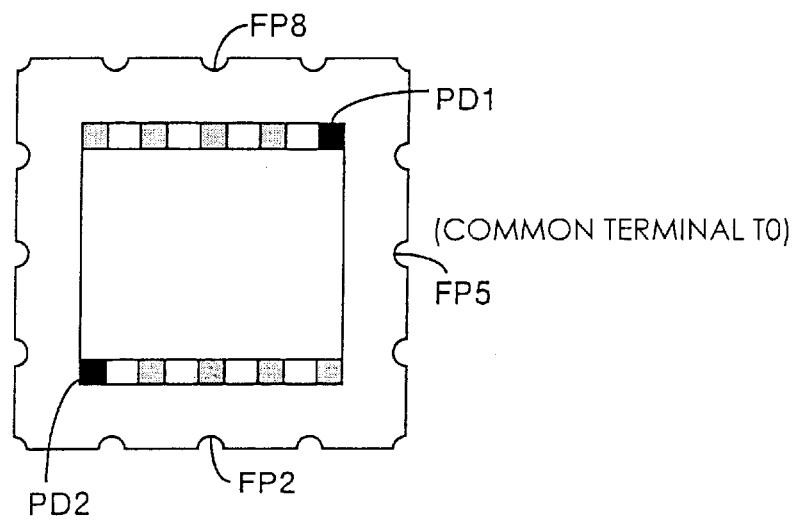
FIGS. 32($a$), 32($b$) and 32($c$) are plane views showing embodiments of the wire bonding pad layer according to the invention.
Figure 32:
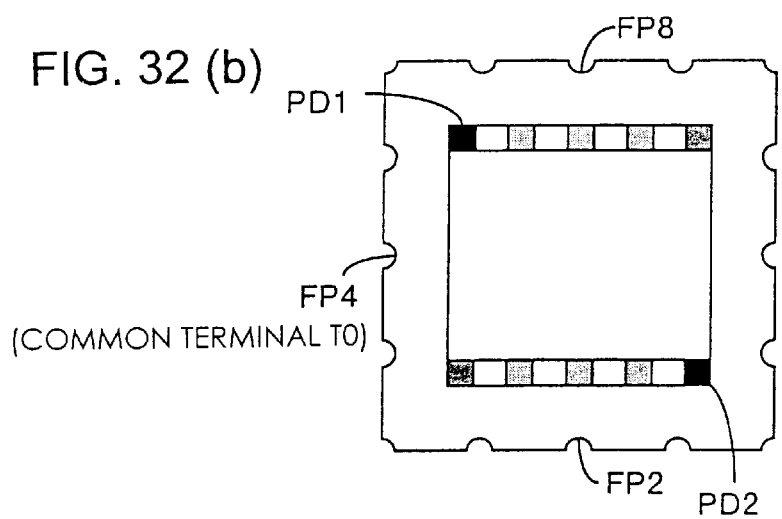
Figure 32:
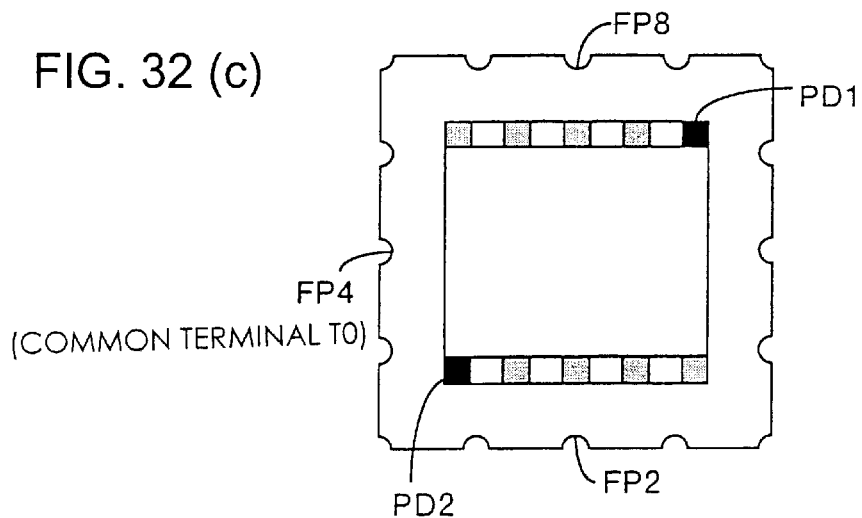
Figure 34:
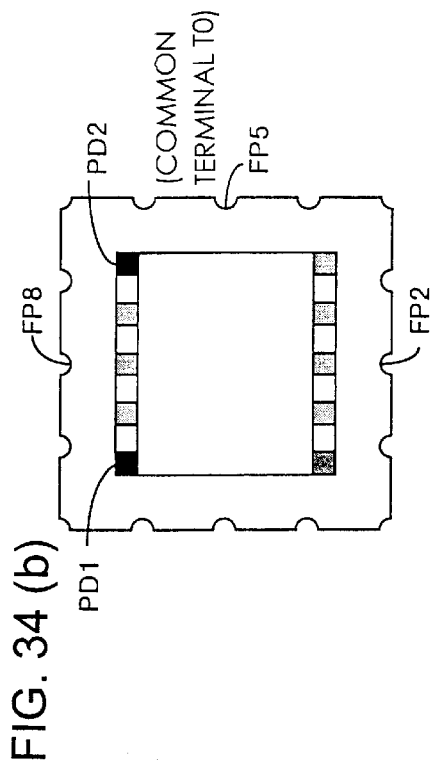
FIGS. 34($a$), 34($b$), 34($c$) and 34($d$) are plane views showing embodiments of the wire bonding pad layer according to the invention.
Figure 34:
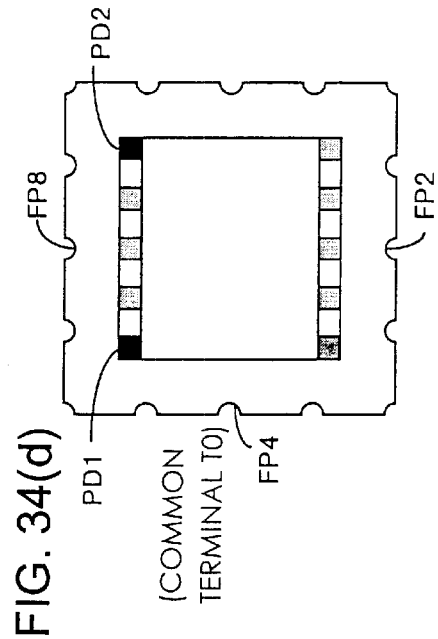
Figure 34:
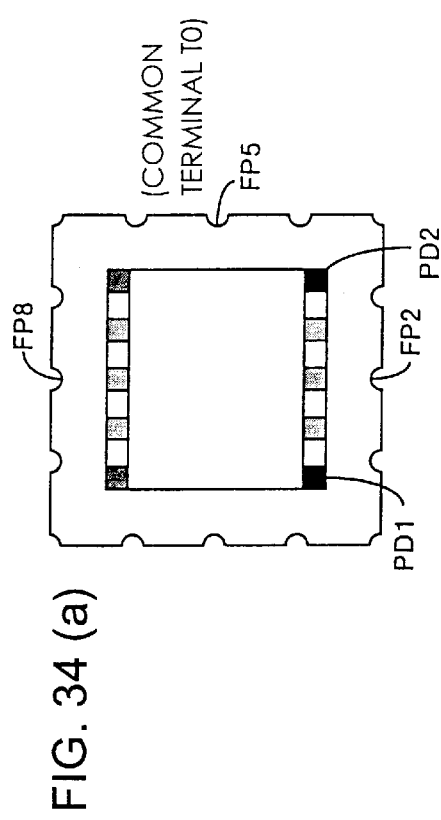
Figure 34D:
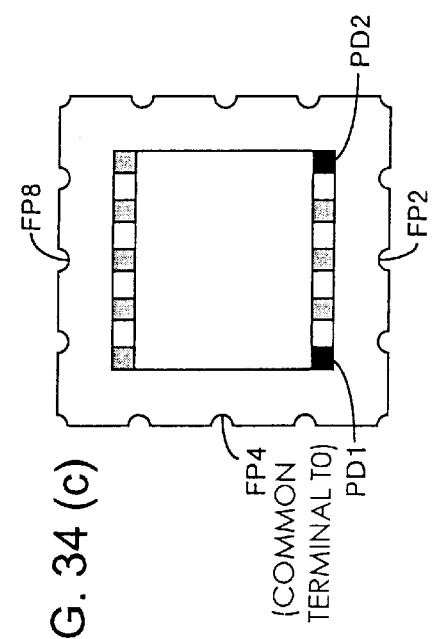

FIG. 31 is a graph showing the relationship between the characteristic impedance value (Q) of the line pattern and the length of the line pattern in the case where the die attach pattern 14 on the die attach layer 6 is divided into four pieces and the case where it is not divided.

It is understood from FIG. 31 that the case where the pattern is divided into four pieces exhibits a higher characteristic impedance value in any length. In other words when the die attach pattern 14 is divided, the characteristic impedance value of the line pattern is high, and therefore good impedance matching can be obtained.

It is considered that this is because of the connection relationship between the die attach pattern 14 and the paste 15. The paste 15 is used to attach the filter chip to the die attach pattern and to prevent breakage of the filter chip caused by the different in thermal expansion coefficients between the filter chip and the package base material. For example, the paste 15 may be either electroconductive or non-electroconductive and may be formed with a material, such as Ag, Cu and Si.

When the die attach pattern 14 is divided, and the connection among the divided pieces of the die attach pattern is achieved only with the electroconductive paste 15, the characteristic impedance value becomes higher than the die attach pattern formed as one solid film. In other words, because the characteristic impedance value is decreased when the die attach pattern 14 is formed as one solid film, the die attach pattern 14 interferes with the line pattern 1 to deteriorate the impedance matching of the matching circuit.

The flatness of the filter chip with respect to the surface of the layer L3 becomes better upon mounting the filter chip on the die attach layer 6 in the case where the die attach pattern 14 is divided coated with the electroconductive paste 15, in comparison to the case where the electroconductive paste is coated on the solid film not divided.

Therefore, the die attach pattern 14 is preferably formed as divided shown in FIG. 30 from the standpoint of the impedance matching of the matching circuit, the breakage prevention of the filter chip and the parallelism of the filter chips. The number of divided pieces may be any of two or more. However, when the number of divided pieces is too large, the shape of the pattern becomes complex and the number of connections to the side castellation is increased, and therefore the number of divided pieces is preferably about 4.

It is understood from FIG. 4 that the line pattern 1 is arranged below the die attach pattern 14 on the die attach layer 6. It has been found that the influence of the die attach pattern to the impedance of the line pattern is small in the case where the ratio of the length of the line pattern that is encompassed by the region directly below the die attach pattern 14 is 33% or less with respect to the total length thereof. For example, it has been found that the deterioration of the impedance value where the ratio is about 30% is better by about 16% than the case where the ratio is about 70%. Therefore, it is preferred that the pattern shape is formed in such a manner that the line pattern does not pass the region directly under the die attach pattern as far as possible.

The distances among the pads (such as WP1) on the wire bonding pad layer 5 shown in FIG. 5 and the like will be described.

A simulation was conducted what extent the interference among the pads occurred in the case where the distances of the wire bonding pads was less than 0.3 mm (for example, 0.15 nm) and the case where the distance was 0.3 mm or more (for example, 0.33 mm).

A simulation of an electric current distribution was measured for the respective wire bonding pads where an electric current was applied between the external connection terminals T0, T1 and T2 and the GND. According to the simulation, it was confirmed that interference of electric current influencing the filter characteristics of the duplexer occurred between the adjacent wire bonding terminals when the distance of the wire bonding pads is less than 0.3 mm, but no conspicuous interference of electric current is confirmed when the distance is 0.3 mm or more.

Therefore, the distance among the wire bonding pads is preferably 0.3 mm or more even when a duplexer of a small size of about 5×5×1.5 mm is constituted according to the invention as shown in FIGS. 4 and 5. However, the distance of the pads in the duplexer of that size is limited to 0.45 mm at most due to the limitation of the package size.

Finally, embodiments of arrangements of the wire bonding pads of the duplexer packages that provide good filter characteristics are shown in FIGS. 32A to 32C, 33A, 33B, 34A to 34D and 35A to 35D, all of which are plane views showing the wire bonding pad layer 5 showing preferred arrangements of the pad PD1 connected to the end LP1 of the line pattern 1 and the, pad PD2 connected to the end of LP2 of the line pattern 1. In all the arrangements, the line pattern having a total length of about λ/4 mm can be formed to provide a minimum distance dS of 1.075 mm.

FIGS. 33A and 33B show the cases where two terminals FP4 and FP5 connected to the common terminal T0 are provided on the side surface. FIGS. 34A to 34D show the cases where the pads PD1 and PD2 connected to the line pattern are arranged at the most distant positions from each other on the same side of the rectangular space for mounting the filters.

Figure 35:
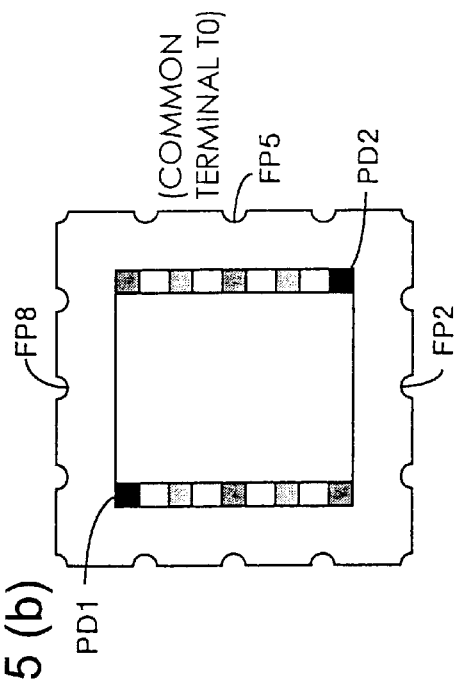
FIGS. 35(a), 35(b), 35(c) and 35(d) are plane views showing embodiments of the wire bonding pad layer according to the invention.
Figure 35:
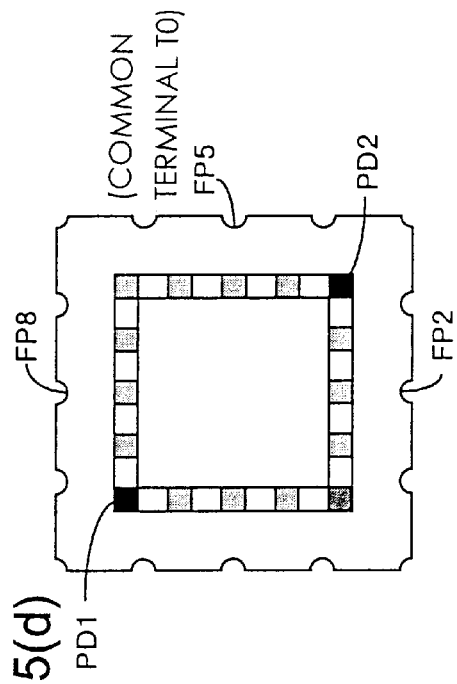
Figure 35:
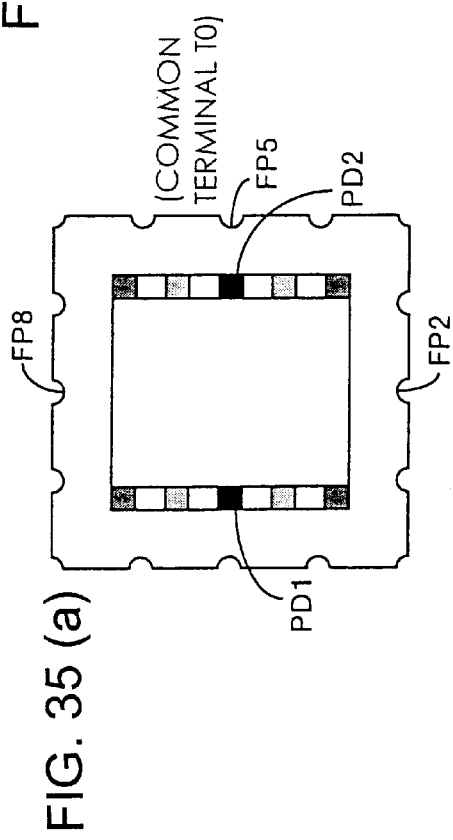
Figure 35D:
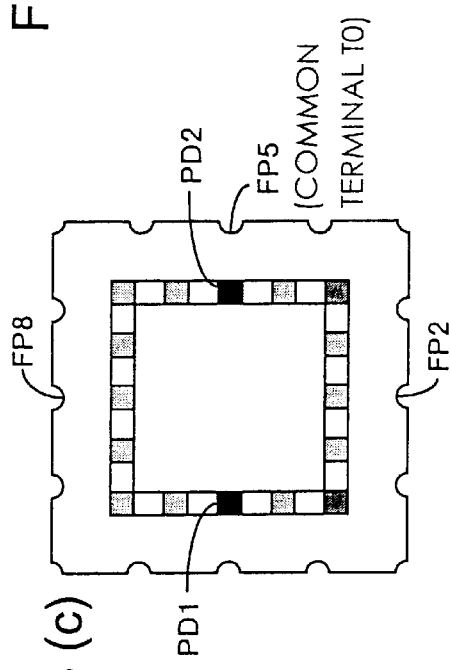
Figure 36:
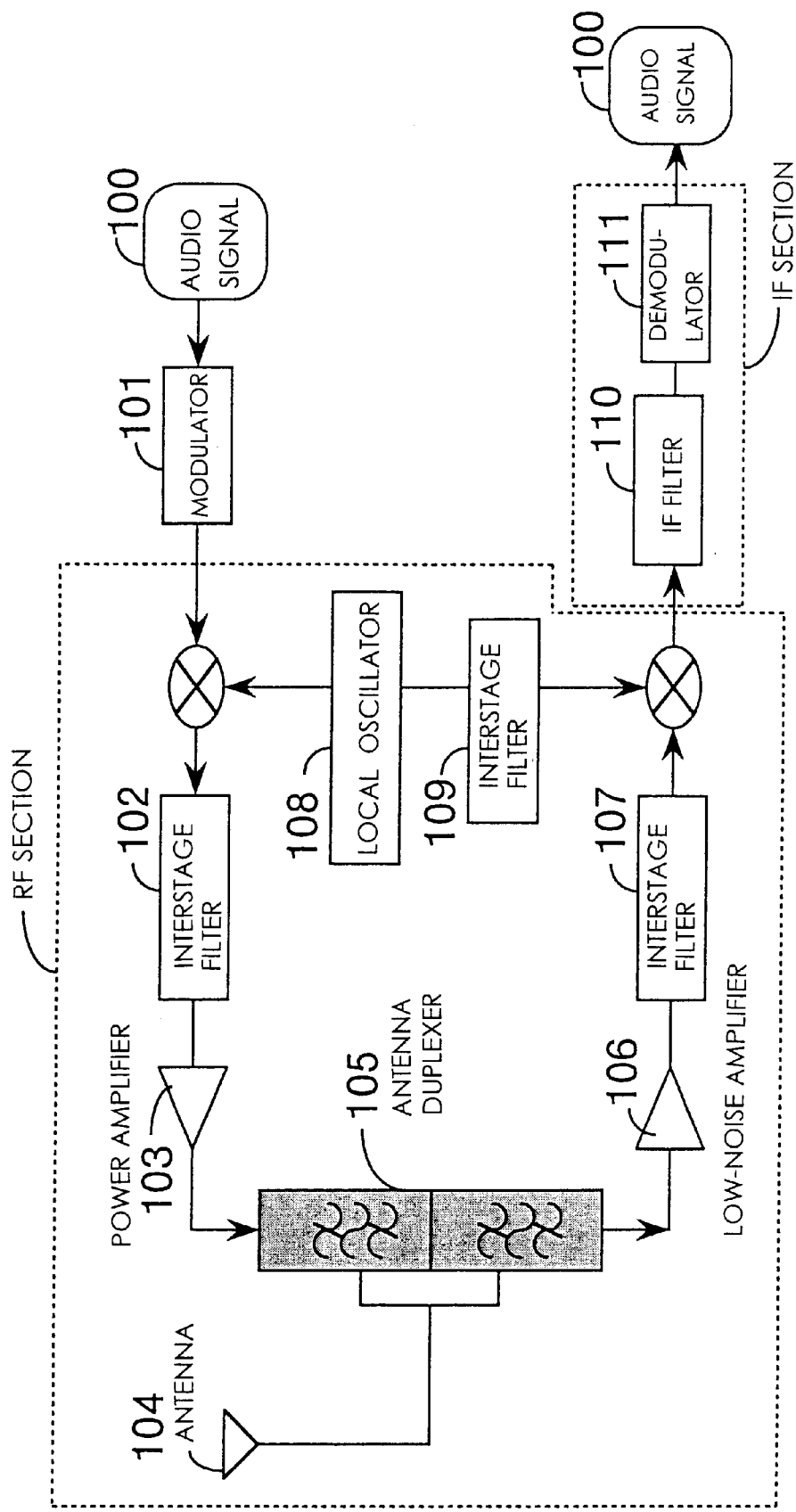
FIG. 36 is a constitutional block diagram showing a radio frequency section of a conventional mobile phone.

FIGS. 35A and 35B show embodiments where the direction of the region where the pads are arranged is rotated by 90° with respect to the embodiments of FIGS. 32A to 32C, and FIGS. 35C and 35D show embodiments where the region for arranging the pads is provided in the entire surrounding region of the rectangular space for mounting the filters.

According to the invention, because the shape of the line pattern and the arrangement of the pads connected to the line pattern formed on the wire bonding pad layer are appropriately configured, a duplexer device can be provided that has a small size and stable depression characteristics of the counter surface acoustic wave filter in the pass band of the surface acoustic wave filter.

What is claimed is:

1. A duplexer device comprising two surface acoustic wave filters having band center frequencies different from each other and a line pattern for matching phases of the two surface acoustic wave filters, wherein provided are:
 a wire bonding pad layer having a plurality of pads including pads for connecting the line pattern with terminals on the surface acoustic wave filters and pads for connecting a common terminal connected to an external antenna with the line pattern; and a a first pad connecting one of the surface acoustic wave filters and a first end of the line pattern and a second pad connecting the common terminal and a second end of the line pattern being arranged at positions that are the most distant from each other inside the wire bonding pad layer.

2. A duplexer device according to claim 1, wherein the wire bonding pad layer has a rectangular space in a substantial center thereof, for mounting therein the two surface acoustic wave filters, and the rectangular space is surrounded by the plural pads, where the first pad and the second pad are arranged at diagonal corners with the rectangular space intervening therebetween.

3. A duplexer device comprising two surface acoustic wave filters having band center frequencies different from each other and a line pattern for matching phases of the two surface acoustic wave filters, wherein provided are:

a wire bonding pad layer having a plurality of pads including pads for connecting the line pattern with terminals on the surface acoustic wave filters and pads for connecting a common terminal connected to an external antenna with the line pattern;

a line pattern layer located below the wire bonding pad layer, the line pattern layer having the line pattern; and an external connection terminal layer located below the line pattern layer, the external connection terminal layer having an external connection terminal for connecting the surface acoustic wave filters with an external circuit, the line pattern layer being formed so that a distance dS between a point in the line pattern layer, at which a path connecting the terminal on the surface acoustic wave filter with the external connection terminal intersects the line pattern layer, and an arbitrary point on the line pattern is set to a prescribed value or more.

4. A duplexer device according to claim 3, wherein a first pad connecting one of the surface acoustic wave filters with a first end of the line pattern and a second pad connecting the common terminal with a second end of the line pattern are arranged at positions that are the most distant from each other inside the wire bonding pad layer.

5. A duplexer device as claimed in claim 4, wherein the wire bonding pad layer has a rectangular space in a substantial center thereof for mounting therein the two surface acoustic wave filters, and the rectangular space is surrounded by the plural pads, where the first pad and the second pad are arranged at diagonal corners with the rectangular space intervening therebetween.

6. A duplexer device according to claim 4 or 5, wherein the common terminal is formed on the external connection terminal layer, and a common terminal lead line for connecting the second pad and the common terminal is formed on a layer different from the line pattern layer.

7. A duplexer device according to claim 6, wherein the common terminal lead line is formed on the wire bonding pad layer.

8. A duplexer device according to claim 6, wherein the common terminal lead line is formed on a layer below the line pattern layer.

9. A duplexer device according to claim 6, wherein a common GND layer having a GND pattern is provided between the layer on which the common terminal lead line has been formed and the line pattern layer.

10. A duplexer device as claimed according to claims 3, 4 or 5, wherein the distance dS is 1.075 mm or more.

11. A duplexer device according to claim 3, wherein a die attach layer for mounting the surface acoustic wave filters is provided below the wire bonding pad layer but above the line pattern layer, a die attach pattern for connecting the surface acoustic wave filters to a GND is formed as patterns divided into two or more on the die attach layer, and the divided die attach patterns are in contact with the surface acoustic wave filters through a paste.

12. A duplexer device according to claim 1 or 3, wherein side surfaces of the layers are covered with a GND layer.

13. A duplexer device according to claim 1 or 3, wherein the plural pads formed on the wire bonding pad layer are formed to have a predetermined distance from each other.

14. A duplexer device according to claim 13, wherein the predetermined distance between the plural pads is 0.3 mm or more and is smaller than the rectangular space for mounting the surface acoustic wave filters.

* * * * *